(12) United States Patent
Yore et al.

(10) Patent No.: US 11,943,594 B2
(45) Date of Patent: Mar. 26, 2024

(54) AUTOMATICALLY ALLOCATING AUDIO PORTIONS TO PLAYBACK DEVICES

(71) Applicant: Sonos, Inc., Santa Barbara, CA (US)

(72) Inventors: Jason Yore, Santa Barbara, CA (US); Nikolai Kutateladze, Santa Barbara, CA (US); Kate Wojogbe, Santa Barbara, CA (US); Edwin Joseph Fitzpatrick, III, Boston, MA (US); Allan Velzy, Mercer Island, WA (US)

(73) Assignee: Sonos Inc., Santa Barbara, CA (US)

( * ) Notice: Subject to any disclaimer, the term of this patent is extended or adjusted under 35 U.S.C. 154(b) by 152 days.

(21) Appl. No.: 17/616,400

(22) PCT Filed: Jun. 5, 2020

(86) PCT No.: PCT/US2020/036409
§ 371 (c)(1),
(2) Date: Dec. 3, 2021

(87) PCT Pub. No.: WO2020/247811
PCT Pub. Date: Dec. 10, 2020

(65) Prior Publication Data
US 2022/0248139 A1    Aug. 4, 2022

Related U.S. Application Data

(60) Provisional application No. 62/858,793, filed on Jun. 7, 2019.

(51) Int. Cl.
*H04R 5/04* (2006.01)
*H03G 5/16* (2006.01)
(Continued)

(52) U.S. Cl.
CPC .............. *H04R 5/04* (2013.01); *H03G 5/165* (2013.01); *H04R 27/00* (2013.01); *H04S 7/302* (2013.01); *H04R 2227/005* (2013.01)

(58) Field of Classification Search
CPC .... H04R 5/04; H04R 27/00; H04R 2227/005; H03G 5/165; H04S 7/302
See application file for complete search history.

(56) References Cited

U.S. PATENT DOCUMENTS

| 4,696,037 A | 9/1987 | Fierens |
| 5,440,644 A | 8/1995 | Farinelli et al. |

(Continued)

FOREIGN PATENT DOCUMENTS

| CN | 106878915 A | 6/2017 |
| EP | 1389853 A1 | 2/2004 |

(Continued)

OTHER PUBLICATIONS

Advisory Action dated Jul. 13, 2017, issued in connection with U.S. Appl. No. 15/078,300, filed Mar. 23, 2016, 3 pages.

(Continued)

*Primary Examiner* — Andrew L Sniezek
(74) *Attorney, Agent, or Firm* — Finch & Maloney PLLC

(57) ABSTRACT

Techniques for allocating audio data between a first playback device and a second playback device are disclosed. The audio data comprises a plurality of audio portions and the method comprises: detecting a trigger associated with the first playback device; responsive to detecting the trigger: retrieving configuration information related to the first playback device and the second playback device; and automatically updating an allocation of the audio portions for reproduction by at least one of the first playback device and the second playback device based on the configuration information.

18 Claims, 16 Drawing Sheets

(51) Int. Cl.
*H04R 27/00* (2006.01)
*H04S 7/00* (2006.01)

(56) References Cited

U.S. PATENT DOCUMENTS

| | | | |
|---|---|---|---|
| 5,553,147 A | 9/1996 | Pineau | |
| 5,761,320 A | 6/1998 | Farinelli et al. | |
| 5,923,902 A | 7/1999 | Inagaki | |
| 6,032,202 A | 2/2000 | Lea et al. | |
| 6,256,554 B1 | 7/2001 | DiLorenzo | |
| 6,404,811 B1 | 6/2002 | Cvetko et al. | |
| 6,469,633 B1 | 10/2002 | Wachter | |
| 6,522,886 B1 | 2/2003 | Youngs et al. | |
| 6,611,537 B1 | 8/2003 | Edens et al. | |
| 6,631,410 B1 | 10/2003 | Kowalski et al. | |
| 6,757,517 B2 | 6/2004 | Chang | |
| 6,778,869 B2 | 8/2004 | Champion | |
| 6,809,635 B1 | 10/2004 | Kaaresoja | |
| 6,882,335 B2 | 4/2005 | Saarinen | |
| 7,130,608 B2 | 10/2006 | Hollstrom et al. | |
| 7,130,616 B2 | 10/2006 | Janik | |
| 7,143,939 B2 | 12/2006 | Henzerling | |
| 7,236,773 B2 | 6/2007 | Thomas | |
| 7,295,548 B2 | 11/2007 | Blank et al. | |
| 7,311,526 B2 | 12/2007 | Rohrbach et al. | |
| 7,483,538 B2 | 1/2009 | McCarty et al. | |
| 7,494,098 B1 | 2/2009 | Fulda | |
| 7,571,014 B1 | 8/2009 | Lambourne et al. | |
| 7,630,501 B2 | 12/2009 | Blank et al. | |
| 7,643,894 B2 | 1/2010 | Braithwaite et al. | |
| 7,657,910 B1 | 2/2010 | McAulay et al. | |
| 7,853,341 B2 | 12/2010 | McCarty et al. | |
| 7,987,294 B2 | 7/2011 | Bryce et al. | |
| 8,014,423 B2 | 9/2011 | Thaler et al. | |
| 8,045,952 B2 | 10/2011 | Qureshey et al. | |
| 8,090,317 B2 | 1/2012 | Burge et al. | |
| 8,103,009 B2 | 1/2012 | McCarty et al. | |
| 8,214,447 B2 | 7/2012 | Deslippe et al. | |
| 8,234,395 B2 | 7/2012 | Millington | |
| 8,326,951 B1 | 12/2012 | Millington et al. | |
| 8,483,853 B1 | 7/2013 | Lambourne | |
| 8,788,080 B1 | 7/2014 | Kallai et al. | |
| 8,867,776 B2 | 10/2014 | Schul | |
| 8,903,526 B2 | 12/2014 | Beckhardt et al. | |
| 8,910,265 B2 | 12/2014 | Lang et al. | |
| 8,995,240 B1 | 3/2015 | Erven et al. | |
| 9,042,556 B2 | 5/2015 | Kallai et al. | |
| 9,137,564 B2 | 9/2015 | Reimann | |
| 9,213,762 B1 | 12/2015 | Erven et al. | |
| 9,223,862 B2 | 12/2015 | Beckhardt | |
| 9,226,072 B2 | 12/2015 | Bender et al. | |
| 9,232,277 B2 | 1/2016 | Vega-Zayas et al. | |
| 9,247,492 B2 | 1/2016 | Millington et al. | |
| 9,285,886 B2 | 3/2016 | Reilly et al. | |
| 9,286,384 B2 | 3/2016 | Kuper et al. | |
| 9,300,647 B2 | 3/2016 | Triplett | |
| 9,329,831 B1 | 5/2016 | Fullerton et al. | |
| 9,330,096 B1 | 5/2016 | Fullerton et al. | |
| 9,361,371 B2 | 6/2016 | Coburn, IV et al. | |
| 9,374,607 B2 | 6/2016 | Bates et al. | |
| 9,450,446 B2 | 9/2016 | Baker et al. | |
| 9,460,755 B2 | 10/2016 | Coburn, IV | |
| 9,501,533 B2 | 11/2016 | Coburn, IV et al. | |
| 9,544,701 B1 | 1/2017 | Rappoport | |
| 9,554,201 B2 | 1/2017 | Williams et al. | |
| 9,560,449 B2 | 1/2017 | Carlsson et al. | |
| 9,608,475 B1 | 3/2017 | Karanikos et al. | |
| 9,665,339 B2 | 5/2017 | Reimann et al. | |
| 9,671,997 B2 | 6/2017 | Triplett | |
| 9,686,282 B2 | 6/2017 | Pollock | |
| 9,715,365 B2 | 7/2017 | Kusano et al. | |
| 9,735,978 B2 | 8/2017 | Kumar et al. | |
| 9,820,039 B2 | 11/2017 | Lang | |
| 9,826,306 B2 | 11/2017 | Lang | |
| 9,952,825 B2 | 4/2018 | Sheen | |
| 9,961,463 B2 | 5/2018 | Wilberding et al. | |
| 9,979,497 B2* | 5/2018 | Lin | H04H 20/71 |
| 10,001,965 B1 | 6/2018 | Lang et al. | |
| 10,003,881 B2 | 6/2018 | Cousins et al. | |
| 10,114,605 B2 | 10/2018 | Gossain et al. | |
| 10,209,947 B2 | 2/2019 | Morganstern et al. | |
| 10,275,138 B2 | 4/2019 | Vega et al. | |
| 10,462,505 B2 | 10/2019 | Coburn, IV et al. | |
| 10,483,786 B2 | 11/2019 | Moussaoui et al. | |
| 10,587,693 B2 | 3/2020 | Beckhardt | |
| 10,715,973 B2 | 7/2020 | Kumar et al. | |
| 11,200,024 B2 | 12/2021 | Lang et al. | |
| 2001/0042107 A1 | 11/2001 | Palm | |
| 2002/0022453 A1 | 2/2002 | Balog et al. | |
| 2002/0026442 A1 | 2/2002 | Lipscomb et al. | |
| 2002/0124097 A1 | 9/2002 | Isely et al. | |
| 2002/0127812 A1 | 9/2002 | Matsunaga et al. | |
| 2003/0157951 A1 | 8/2003 | Hasty, Jr. | |
| 2004/0024478 A1 | 2/2004 | Hans et al. | |
| 2005/0201549 A1 | 9/2005 | Dedieu et al. | |
| 2005/0286546 A1 | 12/2005 | Bassoli et al. | |
| 2007/0003067 A1 | 1/2007 | Gierl et al. | |
| 2007/0021137 A1 | 1/2007 | Kokkonen et al. | |
| 2007/0038999 A1 | 2/2007 | Millington | |
| 2007/0142944 A1 | 6/2007 | Goldberg et al. | |
| 2007/0265031 A1 | 11/2007 | Koizumi et al. | |
| 2008/0144864 A1 | 6/2008 | Huon et al. | |
| 2008/0146289 A1 | 6/2008 | Korneluk et al. | |
| 2009/0164600 A1 | 6/2009 | Issa et al. | |
| 2009/0168760 A1 | 7/2009 | Katis et al. | |
| 2009/0171487 A1 | 7/2009 | Wilhelm | |
| 2009/0217036 A1 | 8/2009 | Irwin et al. | |
| 2009/0312849 A1 | 12/2009 | Cosgrove et al. | |
| 2011/0002487 A1 | 1/2011 | Panther et al. | |
| 2011/0289157 A1 | 11/2011 | Pirnazar | |
| 2012/0051567 A1 | 3/2012 | Castor-Perry | |
| 2012/0206319 A1 | 8/2012 | Lucero et al. | |
| 2012/0317487 A1 | 12/2012 | Lieb et al. | |
| 2013/0129122 A1 | 5/2013 | Johnson et al. | |
| 2013/0248678 A1 | 9/2013 | Kramer | |
| 2013/0305152 A1 | 11/2013 | Griffiths et al. | |
| 2013/0316686 A1 | 11/2013 | Subbaramoo et al. | |
| 2013/0331970 A1 | 12/2013 | Beckhardt et al. | |
| 2014/0006587 A1 | 1/2014 | Kusano | |
| 2014/0030980 A1 | 1/2014 | D'Ambrosio | |
| 2014/0192986 A1 | 7/2014 | Lee et al. | |
| 2014/0195587 A1 | 7/2014 | Sukoff et al. | |
| 2014/0229959 A1 | 8/2014 | Beckhardt et al. | |
| 2014/0230015 A1 | 8/2014 | Pollock | |
| 2014/0270284 A1 | 9/2014 | Luna | |
| 2014/0323036 A1 | 10/2014 | Daley et al. | |
| 2014/0341404 A1 | 11/2014 | Choisel et al. | |
| 2015/0091691 A1 | 4/2015 | Calatayud | |
| 2015/0092947 A1 | 4/2015 | Gossain et al. | |
| 2015/0100991 A1 | 4/2015 | Risberg et al. | |
| 2015/0135108 A1 | 5/2015 | Pope et al. | |
| 2015/0163788 A1 | 6/2015 | Karunakaran | |
| 2015/0212788 A1 | 7/2015 | Lang | |
| 2015/0237424 A1 | 8/2015 | Wilker et al. | |
| 2015/0264509 A1 | 9/2015 | Oishi et al. | |
| 2015/0312608 A1 | 10/2015 | Higa et al. | |
| 2016/0011590 A1 | 1/2016 | Griffiths et al. | |
| 2016/0011848 A1 | 1/2016 | Wilberding et al. | |
| 2016/0011850 A1 | 1/2016 | Sheen et al. | |
| 2016/0014512 A1 | 1/2016 | Wilberding et al. | |
| 2016/0014535 A1 | 1/2016 | Wilberding et al. | |
| 2016/0014536 A1 | 1/2016 | Sheen | |
| 2016/0026428 A1 | 1/2016 | Morganstern et al. | |
| 2016/0026429 A1 | 1/2016 | Triplett | |
| 2016/0162252 A1 | 6/2016 | Di Censo et al. | |
| 2016/0191584 A1 | 6/2016 | Dickow et al. | |
| 2016/0212178 A1 | 7/2016 | Zhang et al. | |
| 2017/0019742 A1 | 1/2017 | Rappoport | |
| 2017/0034648 A1 | 2/2017 | Hutchings et al. | |
| 2017/0090134 A1 | 3/2017 | Williams et al. | |
| 2017/0117754 A1 | 4/2017 | Noori et al. | |
| 2017/0134871 A1 | 5/2017 | Rappoport | |

(56) References Cited

U.S. PATENT DOCUMENTS

2017/0285788 A1  10/2017  Park et al.
2017/0366937 A1  12/2017  Lee et al.
2017/0373537 A1  12/2017  Dayal et al.

FOREIGN PATENT DOCUMENTS

| EP | 2180727 A2 | 4/2010 |
| EP | 2993909 A1 | 3/2016 |
| EP | 3320698 A1 | 5/2018 |
| WO | 200153994 | 7/2001 |
| WO | 2003093950 A2 | 11/2003 |

OTHER PUBLICATIONS

AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
Dempsey, Paul. The Teardown Apple Watch. Apple makes every square inch of real estate in the Watch do a job. Engineering & Technology: Reviews Consumer Technology. Jul. 2015, 2 pages.
"Denon 2003-2004 Product Catalog," Denon, 2003-2004, 44 pages.
European Patent Office, European Extended Search Report dated May 18, 2020, issued in connection with European Application No. 20163524.0, 9 pages.
European Patent Office, European Office Action dated Jun. 4, 2019, issued in connection with European Application No. 16748400.5, 6 pages.
European Patent Office, European Office Action dated Aug. 9, 2018, issued in connection with European Application No. 16748400.5, 4 pages.
European Patent Office, Office Action dated Jan. 18, 2018, issued in connection with European Patent Application No. 16711922.1, 6 pages.
European Patent Office, Summons to Attend Oral Proceedings mailed on Nov. 7, 2018, issued in connection with European Application No. 16711922.1, 13 pages.
Final Office Action dated May 1, 2017, issued in connection with U.S. Appl. No. 15/078,300, filed Mar. 23, 2016, 13 pages.
First Action Interview Office Action dated Oct. 16, 2015, issued in U.S. Appl. No. 14/631,713, filed Feb. 25, 2015, 5 pages.
First Action Interview Office Action dated Oct. 23, 2015, issued in U.S. Appl. No. 14/631,723, filed Feb. 25, 2015, 5 pages.
Goldheart, Andrew. Apple Watch X-ray Teardown. IFIXIT, May 6, 2015, 19 pages.
Horwitz, Jeremy, "Logic3 i-Station25," retrieved from the internet: http://www.ilounge.com/index.php/reviews/entry/logic3-i-station25/, last visited Dec. 17, 2013, 5 pages.
International Bureau, International Preliminary Report on Patentability and Written Opinion, dated Jan. 23, 2018, issued in connection with International Application No. PCT/US2016/042822, filed on Jul. 18, 2016, 8 pages.
International Bureau, International Preliminary Report on Patentability dated Jan. 30, 2014, issued in connection with International Application No. PCT/US2012/045894, filed on Jul. 9, 2012, 6 pages.
International Bureau, International Search Report and Written Opinion dated Sep. 3, 2020, issued in connection with International Application No. PCT/US2020/036409, filed on Jun. 5, 2020, 20 pages.
International Search Authority, International Search Report and Written Opinion dated Oct. 18, 2016, issued in connection with International Application No. PCT/US2016/042822, filed on Jul. 18, 2016, 13 pages.
International Searching Authority, International Search Report and Written Opinion dated May 25, 2016, issued in connection with International Application No. PCT/US2016/019325, filed on Feb. 24, 2016, 11 pages.
International Searching Authority, International Search Report dated Dec. 26, 2012, issued in connection with International Application No. PCT/US2012/045894, filed on Jul. 9, 2012, 3 pages.
International Searching Authority, Written Opinion dated Dec. 26, 2012, issued in connection with International Application No. PCT/US2012/045894, filed on Jul. 9, 2012, 4 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action dated Feb. 1, 2016, issued in connection with U.S. Appl. No. 14/337,536, filed Jul. 22, 2014, 9 pages.
Non-Final Office Action dated Mar. 10, 2017, issued in connection with U.S. Appl. No. 15/357,548, filed Nov. 21, 2016, 6 pages.
Non-Final Office Action dated Feb. 14, 2017, issued in connection with U.S. Appl. No. 15/338,785, filed Oct. 31, 2016, 7 pages.
Non-Final Office action dated Nov. 15, 2016, issued in connection with U.S. Appl. No. 15/078,300, filed Mar. 23, 2016, 8 pages.
Non-Final Office Action dated Feb. 16, 2022, issued in connection with U.S. Appl. No. 17/114,010, filed Dec. 7, 2020, 8 pages.
Non-Final Office Action dated May 16, 2018, issued in connection with U.S. Appl. No. 15/078,006, filed Mar. 23, 2016, 10 pages.
Non-Final Office Action dated Apr. 2, 2018, issued in connection with U.S. Appl. No. 15/688,137, filed Aug. 28, 2017, 8 pages.
Non-Final Office Action dated Aug. 22, 2017, issued in connection with U.S. Appl. No. 15/078,300, filed Mar. 23, 2016, 9 pages.
Non-Final Office Action dated Jul. 29, 2020, issued in connection with U.S. Appl. No. 16/693,560, filed Nov. 25, 2019, 8 pages.
Non-Final Office Action dated Sep. 29, 2017, issued in connection with U.S. Appl. No. 14/844,253, filed Sep. 3, 2015, 17 pages.
Non-Final Office Action dated Feb. 4, 2019, issued in connection with U.S. Appl. No. 15/078,006, filed Mar. 23, 2016, 13 pages.
Non-Final Office Action dated Feb. 4, 2020, issued in connection with U.S. Appl. No. 15/078,006, filed Mar. 23, 2016, 10 pages.
Non-Final Office Action dated Aug. 6, 2019, issued in connection with U.S. Appl. No. 15/078,006, filed Mar. 23, 2016, 7 pages.
Notice of Allowance dated Aug. 1, 2016, issued in connection with U.S. Appl. No. 14/337,536, filed Jul. 22, 2014, 9 pages.
Notice of Allowance dated Feb. 16, 2018, issued in connection with U.S. Appl. No. 14/844,253, filed Sep. 3, 2015, 7 pages.
Notice of Allowance dated Nov. 16, 2016, issued in connection with U.S. Appl. No. 14/803,094, filed Jul. 19, 2015, 7 pages.
Notice of Allowance dated Jul. 19, 2017, issued in connection with U.S. Appl. No. 15/338,785, filed Oct. 31, 2016, 10 pages.
Notice of Allowance dated Oct. 20, 2021, issued in connection with U.S. Appl. No. 17/228,114, filed Apr. 12, 2021, 12 pages.
Notice of Allowance dated Jun. 21, 2017, issued in connection with U.S. Appl. No. 15/357,548, filed Nov. 21, 2016, 7 pages.
Notice of Allowance dated Mar. 23, 2020, issued in connection with U.S. Appl. No. 16/367,808, filed Mar. 28, 2019, 7 pages.
Notice of Allowance dated Jan. 25, 2018, issued in connection with U.S. Appl. No. 15/078,300, filed Jan. 25, 2018, 5 pages.
Notice of Allowance dated Aug. 27, 2018, issued in connection with U.S. Appl. No. 15/688,137, filed Aug. 28, 2017, 7 pages.
Notice of Allowance dated Jan. 28, 2016, issued in U.S. Appl. No. 14/631,713, filed Feb. 25, 2015, 6 pages.
Notice of Allowance dated Jan. 28, 2016, issued in U.S. Appl. No. 14/631,723, filed Feb. 25, 2015, 6 pages.

(56) References Cited

OTHER PUBLICATIONS

Notice of Allowance dated Aug. 29, 2019, issued in connection with U.S. Appl. No. 16/011,273, filed Jun. 18, 2018, 11 pages.
Notice of Allowance dated Dec. 31, 2018, issued in connection with U.S. Appl. No. 16/180,952, filed Nov. 5, 2018, 8 pages.
Notice of Allowance dated Aug. 6, 2020, issued in connection with U.S. Appl. No. 15/078,006, filed Mar. 23, 2016, 7 pages.
Notice of Allowance dated Dec. 7, 2020, issued in connection with U.S. Appl. No. 16/693,560, filed Nov. 25, 2019, 7 pages.
Palm, Inc., "Handbook for the Palm VII Handheld," May 2000, 311 pages.
Preinterview First Office Action dated Sep. 23, 2016, issued in connection with U.S. Appl. No. 14/803,094, filed Jul. 19, 2015, 5 pages.
Presentations at WinHEC 2000, May 2000, 138 pages.
Roland Corporation, "Roland announces BA-55 Portable PA System," press release, Apr. 6, 2011, 2 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.0 Owner's Manual; Copyright 2008, 501 pages.
Yamaha DME Designer 3.5 setup manual guide; copyright 2004, 16 pages.
Yamaha DME Designer 3.5 User Manual; Copyright 2004, 507 pages.
European Patent Office, European EPC Article 94.3 mailed Sep. 1, 2023, issued in connection with European Application No. 21210296.6, 8 pages.
European Patent Office, European EPC Article 94.3 mailed on Mar. 7, 2022, issued in connection with European Application No. 20163524.0, 6 pages.
European Patent Office, European Search Report dated Nov. 11, 2022, issued in connection with European Application No. 21210296.6, 10 pages.
Non-Final Office Action dated Jul. 7, 2022, issued in connection with U.S. Appl. No. 17/548,878, filed Dec. 13, 2021, 6 pages.
Non-Final Office Action dated Apr. 27, 2023, issued in connection with U.S. Appl. No. 17/938,601, filed Oct. 6, 2022, 8 pages.
Notice of Allowance dated Jun. 8, 2022, issued in connection with U.S. Appl. No. 17/114,010, filed Dec. 7, 2020, 9 pages.
Notice of Allowance dated Oct. 18, 2023, issued in connection with U.S. Appl. No. 17/938,601, filed Oct. 6, 2022, 9 pages.
Notice of Allowance dated Sep. 21, 2022, issued in connection with U.S. Appl. No. 16/944,797, filed Jul. 31, 2020, 9 pages.
Notice of Allowance dated Jan. 27, 2023, issued in connection with U.S. Appl. No. 17/548,878, filed Dec. 13, 2021, 7 pages.
European Patent Office, European EPC Article 94.3 dated Dec. 20, 2023, issued in connection with European Application No. 20750422.6, 26 pages.

\* cited by examiner

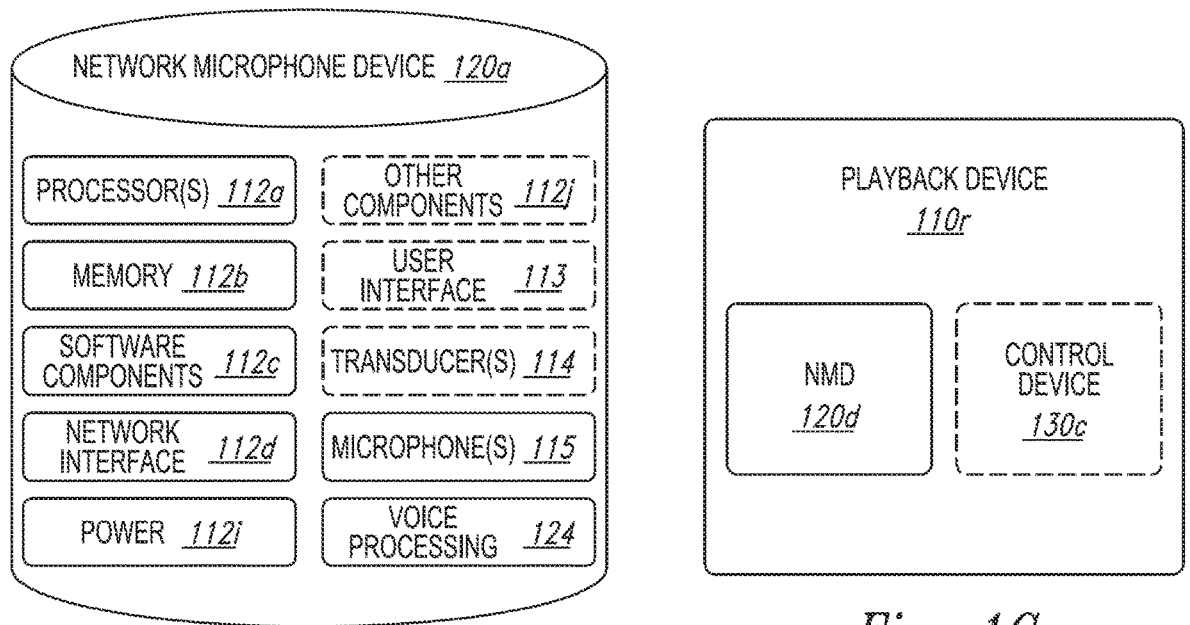
*Fig. 1F*
*Fig. 1G*
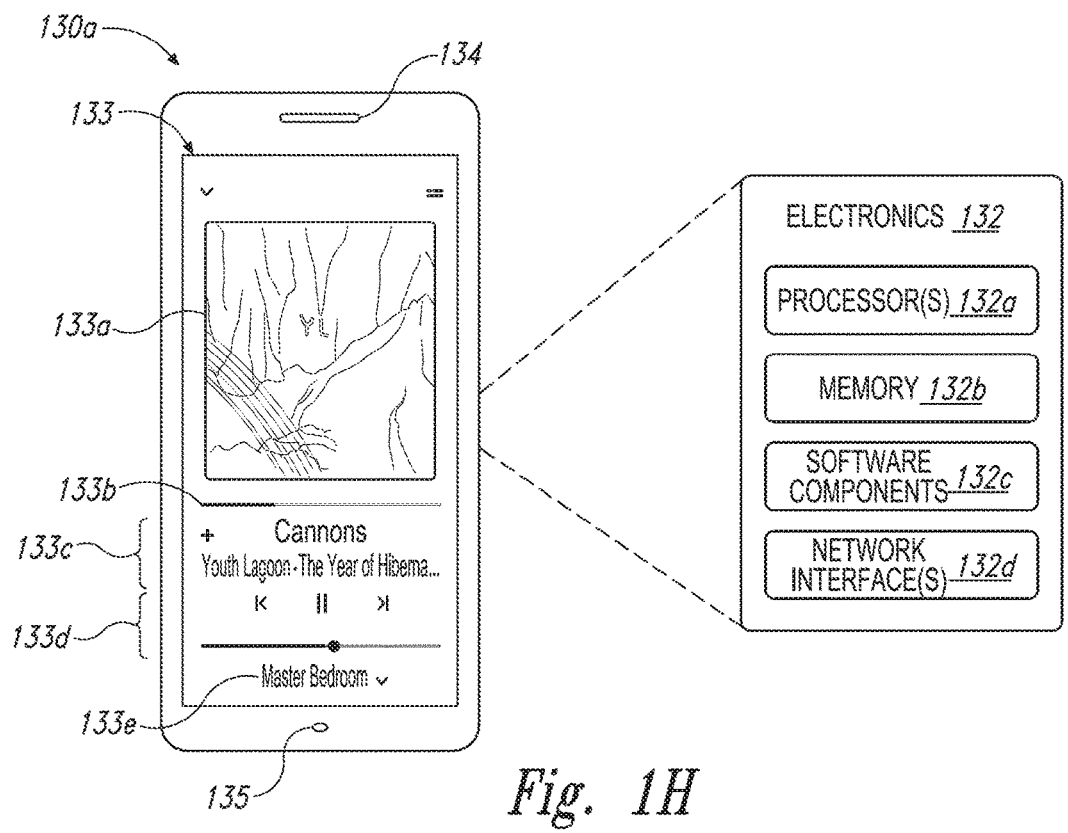
*Fig. 1H*

AUTOMATICALLY ALLOCATING AUDIO PORTIONS TO PLAYBACK DEVICES

CROSS REFERENCE TO RELATED APPLICATIONS

This application is a U.S. National Phase Application under 35 U.S.C. § 371 of International Application No. PCT/US2020/036409, filed on Jun. 5, 2020, which claims priority to U.S. Provisional Patent Application No. 62/858,793, filed on Jun. 7, 2019, titled "AUTOMATICALLY ALLOCATING AUDIO PORTIONS TO PLAYBACK DEVICES," which are each incorporated herein by reference in its entirety

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

Figure 1A:
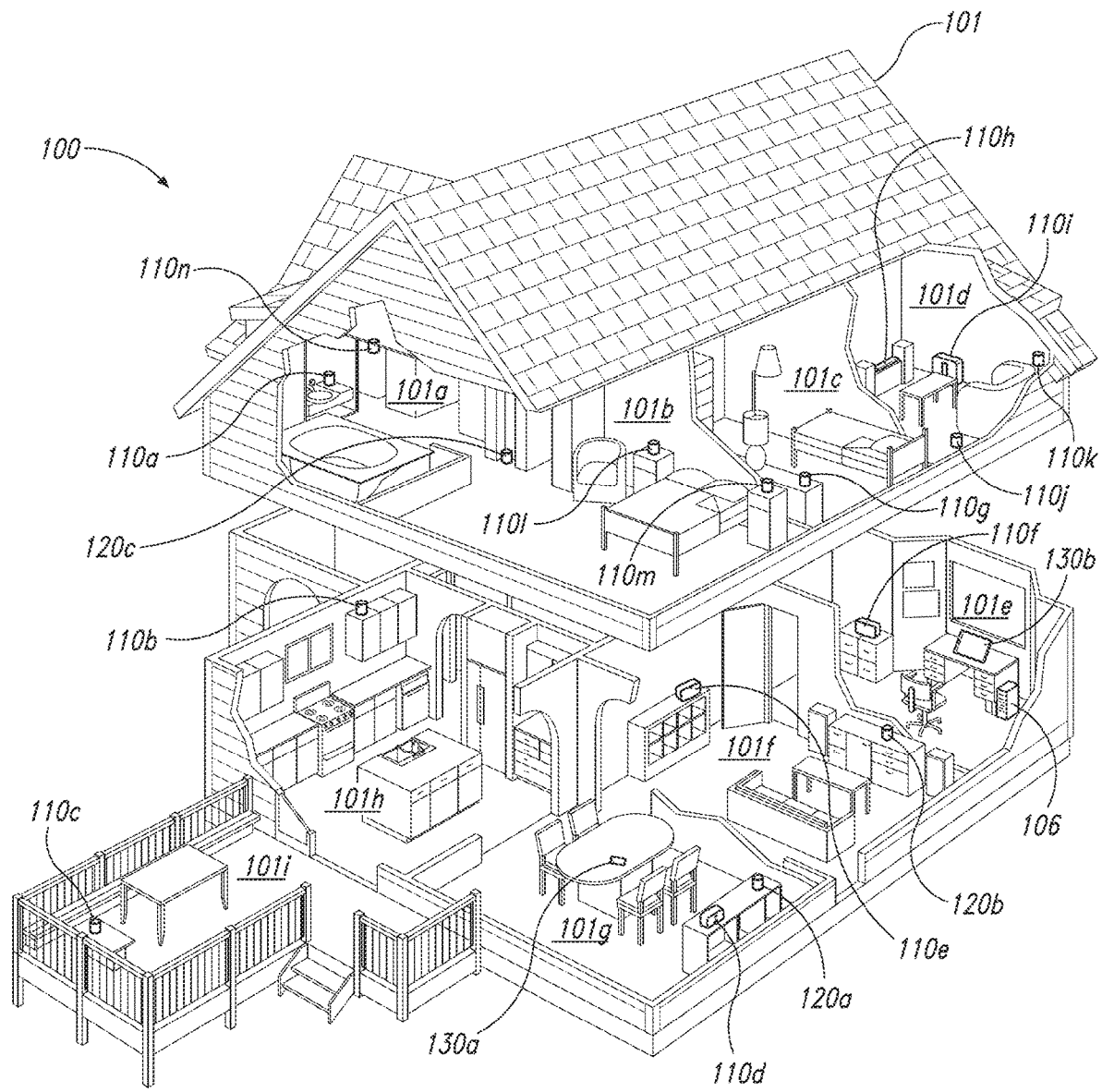
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

SONOS, Inc. has been a consistent innovator in the sound experience space over the past decade. For example, SONOS, Inc. created stereo pair functionality for playback devices that allows two playback devices to be bonded together to form a stereo pair as described in U.S. Pat. No. 8,788,080, issued on Jul. 22, 2014, titled "MULTI-CHANNEL PAIRING IN A MEDIA SYSTEM," which is incorporated herein by reference in its entirety. After creating stereo pair functionally, SONOS, Inc. went on to create dynamic grouping functionality for playback devices as described in U.S. Pat. No. 9,329,831, issued on May 3, 2016, titled "PLAYBACK EXPANSION," which is incorporated herein by reference in its entirety. In furtherance of the consistent innovation by SONOS, Inc. in the sound experience space, SONOS, Inc. has developed new techniques for intelligently distributing audio between playback devices based on information about the current operating conditions, such as information regarding a configuration of the players and/or user preferences, to further improve the sound experience in dynamic environments (e.g., households, venues, businesses, etc.) employing, for example, portable players (e.g., being moved relative to each other) and/or a combination of stationary players and portable playback devices (e.g., being moved relative to each other and/or the stationary players).

Accordingly, aspects of the present disclosure relate to automatically allocating audio portions (e.g., audio channels, frequency ranges, etc.) in response to a detected trigger and based on retrieved configuration information. For example, a portable playback device can be moved to different locations within a playback system. As the portable playback device changes position, the audio that it is desired to reproduce will also change. While the portable playback device may be reconfigured manually each time it is moved to a new location, this is inconvenient, potentially requiring access to a separate control device and/or interrupting the reproduction of any media. The configuration can also be complex, involving not just grouping playback devices to play media in synchrony, but adjusting audio allocations between those devices. Audio allocation can be based on one or more of channels (such as a left channel, a right channel, etc.) and frequency ranges (such as low frequencies below a predetermined threshold, other frequencies above the predetermined threshold, etc.). Accordingly, aspects of the present disclose relate to automatic configuration of such audio allocation for an improved user experience. For example, techniques are described herein to update the audio allocation responsive to a trigger being detected based on retrieved configuration information to inform the audio allocation. In this way, audio allocations can be updated without requiring user input to provide an improved user experience.

In some embodiments, for example, a method of allocating audio data between a first playback device and a second playback device is provided. The audio data comprises a plurality of audio portions and the method comprises: detecting a trigger associated with the first playback device; and responsive to detecting the trigger: retrieving configuration information related to the first playback device and the second playback device; and automatically updating an allocation of the audio portions for reproduction by at least one of the first playback device and the second playback device based on the configuration information.

A wide variety of triggers may be used in the method. Example triggers include a detected voice input, an input from a user interface on a control device, an input from a user interface on a playback device such as a button press, or a detection of a change in position of the playback device relative to other playback devices in a playback system. The configuration information may comprise one or more state variables which include information of the devices in the playback system and/or the current configuration of those devices. The audio allocation, such as channel or frequency range for reproduction, is then updated based on the configuration information. This can provide an improved user experience in several ways.

When the trigger is associated with a movement of a playback device to a new position a variety of different actions can take place. For example, moving a playback device to a position away from a device that it was previously bonded with to reproduce one channel of a stereo pair may result in that playback device automatically changing its audio allocation to reproduce all channels. Moving a playback device to a position in proximity to another playback device may result in the audio allocation being updated so that the playback device reproduces one channel of a stereo pair or one channel of a surround sound or home theater setup. Additionally or alternately, the updating the audio allocation may involve updating a frequency allocation. For example, changing the position of a device so that it is no longer in proximity to a subwoofer may update the audio allocation to reproduce low frequencies (e.g., the low frequencies previously allocated to the subwoofer).

When the trigger is associated with a voice input, the audio allocation can relate to providing the response (e.g., an audible response) from a voice assistant. For example, a response may be provided from a playback device closest to the voice input, from a primary device designated for providing voice responses, from all devices in the vicinity of the voice input and so on, updating the audio allocation as required. This can allow, for example, playback devices which do not include microphones to provide responses to voice inputs detected by other devices. Similarly, a frequency balance or equalization may be adjusted, such as the audio allocation being adjusted so that a subwoofer is not used when providing a response from a voice assistant.

It should be appreciated that incorporating configuration information into player grouping may provide any of a variety of benefits over conventional grouping techniques that force users to manually define all aspects of the group (e.g., which players are in the group, which frequencies the players are to reproduce, etc.). By considering retrieved configuration information and updating the audio allocation based on that configuration information, embodiments described herein provide a more seamless user experience because the configuration information can inform how an audio allocation is updated. It is not necessary, for example, for a user to have defined beforehand how a playback device should behave in response to a particular trigger, instead, once the trigger is detected audio allocation is updated automatically based on retrieved configuration information.

The trigger may indicate that the first playback device is to be grouped with the second playback device for playback of media. The method may then comprise: further responsive to detecting the trigger, causing the first playback device and the second playback device to join together in a group of playback devices for media playback. The automatically updating the allocation of the audio portions comprises automatically updating the allocation of the audio portions for reproduction of media in synchrony by the first and second playback devices. This allows a synchrony group to be configured automatically and the audio allocations updated as required based on the configuration of the devices. For example, the automatically updating audio allocations may also update channels and/or frequency bands reproduced by one or both of the first and second devices.

In one example, the automatically updating the allocation of the audio portions for reproduction of media in synchrony comprises determining that the configuration information indicates that the second playback device is configured to reproduce all the audio portions, and responsively allocating a first subset of the audio portions to the first playback device and a second subset of the audio portions to the second playback device, wherein the first subset and second subset are different. In this way the audio allocation of both first and second devices are updated, for example to adjust one to be a left channel and the other a right channel of stereo audio, or to adjust one to reproduce low frequencies or a low frequency effects channel and the other to reproduce other channels/frequencies, in the case of adding a subwoofer to a playback device than can reproduce full range audio (e.g., a full range of frequencies which can be perceived by a listener). In another example, the automatically updating the allocation of the audio portions for reproduction of media in synchrony comprises determining that the configuration information indicates that both the first playback device and the second playback device have a same associated identifier, and responsively allocating a first subset of the audio portions to the first playback device and a second subset of the audio portions to the second playback device, wherein the first subset and second subset are different. The identifier may a name allocated to the device such as "Living Room". In both of these examples the audio allocation of the second device is updated along with the first device; the trigger causes not just the first device to join a synchrony group with an allocation of audio portions, but for the audio portions reproduced by the second device to be changed.

In some examples, the method may further comprise determining a position of the first playback device relative to the second playback device; and allocating the first and second subsets of the audio portions based on the determined position. This allows the allocating the audio portions to take into account a determined position of the playback devices, such as to allow left and right channels to allocated to a device in the respective position.

The position may be determined in various ways. In one example, the determining a position comprises: causing the second playback device to emit a sound; receiving the sound via a microphone array comprising a plurality of microphones provided on the first playback device; and determining the position based on the relative magnitude of the received sound at two or more of the plurality of microphones in the microphone array. In this way the position can be determined without requiring any further user interaction or additional devices. The method can be used regardless of whether the second playback device also comprises a microphone array. For example, the microphone can be directional and location a direction of the received sound relative to the first playback device. The emitted sound could be audible or inaudible. Inaudible sound could be ultrasonic, outside the range of typical human hearing, and/or having a frequency above 20 kHz; providing that the second device can reproduce the sound and the microphone array can detect it.

In another example, the determining a position comprises: determining a first proximity of a control device to the first playback device; determining a second proximity of the control device to the second playback device; and determining the position based on the first proximity, the second proximity, and a predetermined position of the control device. This may make use of a known position of a control device to determine the position. For example, a user may be directed to place a control device at a predetermined position (such as near a particular playback device). Alternatively, the position of the control device may already be known, for example a known position of a Network Microphone Device or other network connected device, for example smart devices for security or home automation. This example can work with all playback devices; there is no requirement for at least one of the playback devices to include a microphone.

When proximity is determined with reference to a control device, sounds may also be used to determine proximity. The determining the first proximity may comprise: causing the first playback device to emit a first sound and receiving the first sound via at least one microphone on a control device; and the determining the second proximity may comprise causing the second playback device to emit a second sound and receiving the second sound via the at least one microphone on the control device. The first and second sounds can be the same and spaced apart in time, or could be substantially simultaneous and have different characteristics, for example occupying different frequency bands. The proximity can be determined with reference to the loudest sound detected by the control device. For example, if the control device is known to be at a left position then the playback device emitting the loudest detected sound may be determined to be in the left position and the audio allocations updated as appropriate. This allows relative position to be determined without requiring a directional microphone array, which may not be present on the control device.

When proximity is determined with reference to a control device, wireless communication may also be used to determine proximity. The determining the first proximity may be based on a wireless communication between the control device and the first playback device; and the determining the second proximity may be based on a wireless communication between the control device and the second playback device. The wireless communication could make use of indications of wireless signal strength to determine proximity. These could be direct indications, such as a Received Signal Strength Indication (RSSI) of a wireless signal at the control device, indirect indications such as the physical data rate of the wireless communication channel at the control device (which is generally inversely proportional to distance all other things being equal), or the Bit Error Rate (BER) at the control device (which is generally proportional to distance all other things being equal), or involve higher level protocols, such as the Bluetooth® proximity profile (PXP) as defined with reference to the Bluetooth® Generic Attribute profiles (GATT).

In the methods determining proximity with reference to a control device, no user interaction may be required (when the control device is located at a predetermined position already) or reduced user interaction may be required, for example relocating the control device to the predetermined position.

The examples in which position can be determined can be applied to more than first and second devices, for example locating devices in a home theater or surround sound setup, such as three, four, five, six or seven playback devices, possibly also with a subwoofer for low frequencies or a low frequency effects channel (the position of the subwoofer may not be discernable to a listener so determining the position of the subwoofer may be omitted from determined the position).

In some examples, the method may comprise retrieving preference data, and the automatically updating the allocation is further based on the preference data. For example, the user may set a default pairing type which overrides other types of audio allocation. This could apply global defaults to give more control over the automatic allocating of audio portions. The user preferences may include whether automatic bonding into a stereo pairing is enabled, or whether a particular playback device should always reproduce particular audio portions, such as all the audio portions or a subset of all the audio portions. Other preferences may define how playback devices when the trigger results in the removal of a device from a group, for example whether one or neither of the playback devices continues to reproduce audio after the audio allocations are updated to reflect the removal of the playback device. The preference data may be stored in a playback device, in a control device, or remotely, such as in an internet accessible server system and be separate from or form part of the configuration information.

The automatic allocation of audio portions can be based on the configuration information in further ways in additional examples. In one example, the method comprises determining that the configuration information indicates that the second playback device is configured to reproduce a subset of all channels of audio, and responsively allocating all audio portions to the first playback device. If the second playback device is already allocated a subset of all channels of audio, it is likely that this is for a particular reason, such as the second device already being configured for bonded playback with other devices. In this case, the automatic allocating allocates all audio portions to the first device, so that these can be reproduced in addition rather than disrupting existing settings. In another example, the method comprises determining that the configuration information indicates that the first playback device is operating on battery power and that a remaining battery life of the first playback device is below a predetermined threshold, and responsively allocating all audio portions to the first playback device. The threshold may be expressed as a percentage, for example less than 50% or less than 25% of battery power remaining; as a time, for example less than 2 hours, less than 1 hour or less than 30 minutes; or as absolute value, such as less than 15 Watt-hours (Wh), less than 10 Wh, less than 5 Wh or less than 1 Wh. In this case the automatic allocating assigns all audio portions to the first playback device to provide an improved listening experience should the battery run out during reproduction. A sudden loss of some portions of audio may be less likely to be perceived by the listener at the point the battery runs out.

One of the triggers for the method may be a voice input which is received by a microphone array on the first playback device, the automatically updating the allocation of audio portions for reproduction then comprises determining at least one playback device to respond to the voice input. This can allow the most appropriate device to respond to voice input. The determine of the allocation may depend on the nature of the response, for example using both first and second playback devices for music reproduction and a single one for information or a reply from a voice assistant (so that the updating the allocation then includes allocating one of the playback devices no audio portions). The allocating may also depend on what system setup is determined from the configuration information, such as updating the audio allocations so that a primary device reproduces the response to the voice input (which may be a soundbar or soundbase in a home theater or surround setup, or defined by a user in preference information).

Where the trigger is a voice input, the voice input may be further received by a microphone array on the second playback device, and the automatically updating the allocation of audio portions can be further based on the voice input received by the first playback device and the voice input received by the second playback device. This may allow the device closest to the user to respond to the voice input, using the recorded sound pressure by the microphone at each device to determine which received the loudest sound and is therefore closest to the user. In this way a particular playback device or devices may be allocated audio portions for a response from a voice assistant. Relative volumes may be adjusted amongst the playback devices to account for a position of the listener (assuming the voice input was received from the listening position).

In some examples, the allocating the audio portions may be for a particular time period, so that the updated allocation does not remain in place indefinitely. For example, when the allocation of the audio portions is triggered by a voice input, the updating the audio allocations may be for the duration of the response to the voice input and revert back to the previous audio allocations once the response is complete.

In another embodiment, a playback device comprises: a wireless interface configured to receive audio data comprising a plurality of audio portions; a speaker for reproducing at least one of the plurality of audio portions received via the wireless interface; a storage; and a processing system. The storage comprises computer-readable instructions, such as non-transitory computer-readable instructions that, when executed by the processing system, instruct the playback device to carry out a method as described above.

In another embodiment, a playback device comprises: a wireless interface configured to receive audio data comprising a plurality of audio portions; a speaker for reproducing at least one of the plurality of audio portions received via the wireless interface; a storage; and a processing system. The storage comprises non-transitory computer-readable instructions that, when executed by the processor instruct the playback device to: responsive to a trigger associated with the playback device and indicating that the playback device is to be grouped with another playback device for playback of media: retrieve configuration information related to the playback device and the another playback device; cause the playback device and the another playback device to join together in a group for synchronous media playback; and automatically update an allocation of the audio portions for reproduction by the playback device based on the configuration information. Such a playback device can be grouped with another playback device in response to a trigger, reducing user input and simplifying setup of a playback systems in which playback devices are grouped. For example, grouping can be achieved without requiring a separate control device, user input, or pre-configuration of the grouped devices.

The non-transitory computer-readable instructions, when executed by the processor, may instruct the playback device to: determine either: (i) that the configuration information indicates that the another playback device is configured to reproduce all the audio portions, or (ii) that the configuration information indicates that both the playback device and the another playback device have a same associated identifier, and responsively allocate a first subset of the audio portions to the playback device and a second subset of the audio portions to the another playback device, wherein the first subset and second subset are different. This can allow automatic allocation so that the playback device forms part of a bonded setup in which different playback devices reproduce different channels of audio, such as a left and right stereo setup between two devices.

The playback device may comprise a microphone array. The non-transitory computer-readable instructions, when executed by the processor, can instruct the playback device to: cause the second playback device to emit a sound; receiving the sound via the microphone array; and determine a position of the playback device relative to the another playback device based on the received sound and the first subset and the second subset are based on the position. Such a device can automatically determine whether it is positioned as the left or right device in stereo pair, for example, and update the audio allocation to reflect this.

The playback device may comprise a battery. The non-transitory computer-readable instructions, when executed by the processor, can instruct the playback device to determine that the playback device is operating on battery power and that a remaining battery life of the playback device is below a predetermined threshold, and responsively allocating all audio portions to the playback device. This can provide a less disruptive experience should the battery of the playback device subsequently run out during media playback.

According to another embodiment, a playback device comprises: a wireless interface configured to receive audio data comprising a plurality of audio portions; a speaker for reproducing at least one of the plurality of audio portions received via the wireless interface; a microphone array; a storage; and a processing system. The storage comprises non-transitory computer-readable instructions that, when executed by the processor instruct the playback device to: responsive a voice input received by the microphone array: retrieve configuration information related to the playback device and another playback device; and automatically update an allocation of the audio portions for the playback device to reproduce the response to the voice input based on the configuration information. Such a playback device can allocate audio as appropriate for the response to the voice input, such as allocating a playback device closest to a user, or playback devices suitable for the nature of the response.

The non-transitory computer-readable instructions, when executed by the processor, can instruct the playback device to: determine that the configuration information indicates the playback device is configured to reproduce a first subset of the audio portions in synchrony with the another playback device and responsively updating the allocation of audio portions between the playback device and the another playback device such that the response to the voice input is reproduced by the another playback device and not the playback device. This can allow a most appropriate device to respond, which may be another device than the one that received the voice input.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG. 1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs"), 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-3F.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the balcony 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B, 1E and 1I-1M.

In some aspects, one or more of the playback zones in the environment 101 may each be playing different audio content. For instance, a user may be grilling on the patio 101i and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

To facilitate synchronous playback, the playback device (s) described herein may, in some embodiments, be configurable to operate in (and/or switch between) different modes such as a group coordinator mode and/or a group member mode. While operating in the group coordinator mode, the playback device may be configured to coordinate playback within the group by, for example, performing one or more of the following functions: (i) receiving audio content from an audio source, (ii) using a clock (e.g., a physical clock or a virtual clock) in the playback device to generate playback timing information for the audio content, (iii) transmitting portions of the audio content and playback timing for the portions of the audio content to at least one other playback device (e.g., at least one other playback device operating in a group member mode), and/or (iv) playing back the audio content in synchrony with the at least one other playback device using the generated playback timing information. While operating in the group member mode, the playback device may be configured to perform one or more of the following functions: (i) receiving audio content and playback timing for the audio content from the at least one other device (e.g., a playback device operating in a group coordinator mode); and/or (ii) playing the audio content in synchrony with at least the other playback device using the playback timing for the audio content.

a. Suitable Media Playback System

Figure 1B:
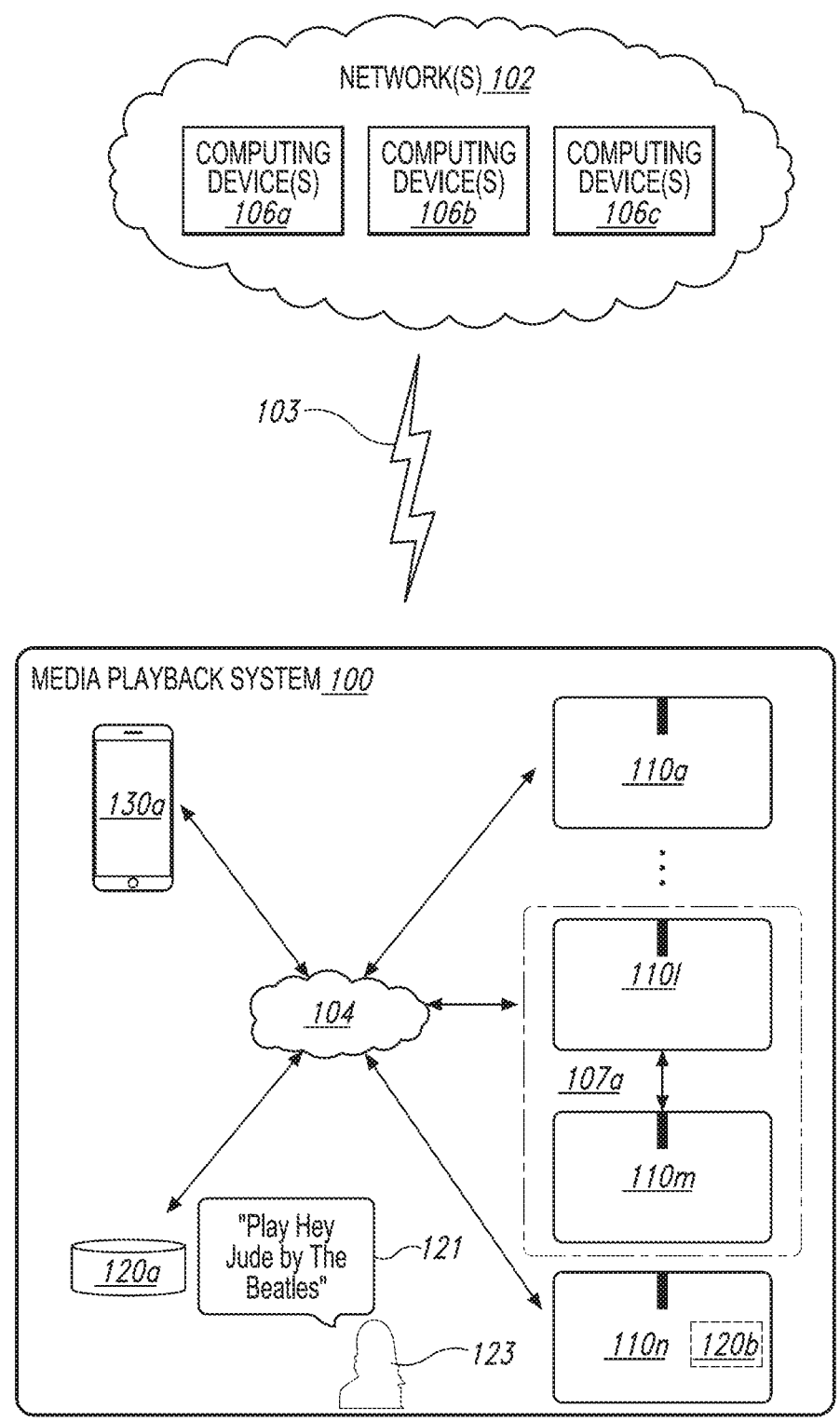
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN) (e.g., the Internet), one or more local area networks (LAN) (e.g., one or more WIFI networks), one or more personal area networks (PAN) (e.g., one or more BLUETOOTH networks, Z-WAVE networks, wireless Universal Serial Bus (USB) networks, ZIGBEE networks, and/or IRDA networks), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106a, a second computing device 106b, and a third computing device 106c). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct or indirect connections, PANs, LANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110*l* and 110*m* comprise a group 107*a*. The playback devices 110*l* and 110*m* can be positioned in different rooms in a household and be grouped together in the group 107*a* on a temporary or permanent basis based on user input received at the control device 130*a* and/or another control device 130 in the media playback system 100. When arranged in the group 107*a*, the playback devices 110*l* and 110*m* can be configured to play back the same or similar audio content in synchrony from one or more audio content sources. In certain embodiments, for example, the group 107*a* comprises a bonded zone in which the playback devices 110*l* and 110*m* comprise left audio and right audio channels, respectively, of multi-channel audio content, thereby producing or enhancing a stereo effect of the audio content. In some embodiments, the group 107*a* includes additional playback devices 110. In other embodiments, however, the media playback system 100 omits the group 107*a* and/or other grouped arrangements of the playback devices 110. Additional details regarding groups and other arrangements of playback devices are described in further detail below with respect to FIGS. 1-I through 1M.

The media playback system 100 includes the NMDs 120*a* and 120*b*, each comprising one or more microphones configured to receive voice utterances from a user. In the illustrated embodiment of FIG. 1B, the NMD 120*a* is a standalone device and the NMD 120*b* is integrated into the playback device 110*n*. The NMD 120*a*, for example, is configured to receive voice input 121 from a user 123. In some embodiments, the NMD 120*a* transmits data associated with the received voice input 121 to a voice assistant service (VAS) configured to (i) process the received voice input data and (ii) transmit a corresponding command to the media playback system 100. In some aspects, for example, the computing device 106*c* comprises one or more modules and/or servers of a VAS (e.g., a VAS operated by one or more of SONOS®, AMAZON®, GOOGLE® APPLE®, MICROSOFT®). The computing device 106*c* can receive the voice input data from the NMD 120*a* via the network 104 and the links 103. In response to receiving the voice input data, the computing device 106*c* processes the voice input data (i.e., "Play Hey Jude by The Beatles"), and determines that the processed voice input includes a command to play a song (e.g., "Hey Jude"). The computing device 106*c* accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
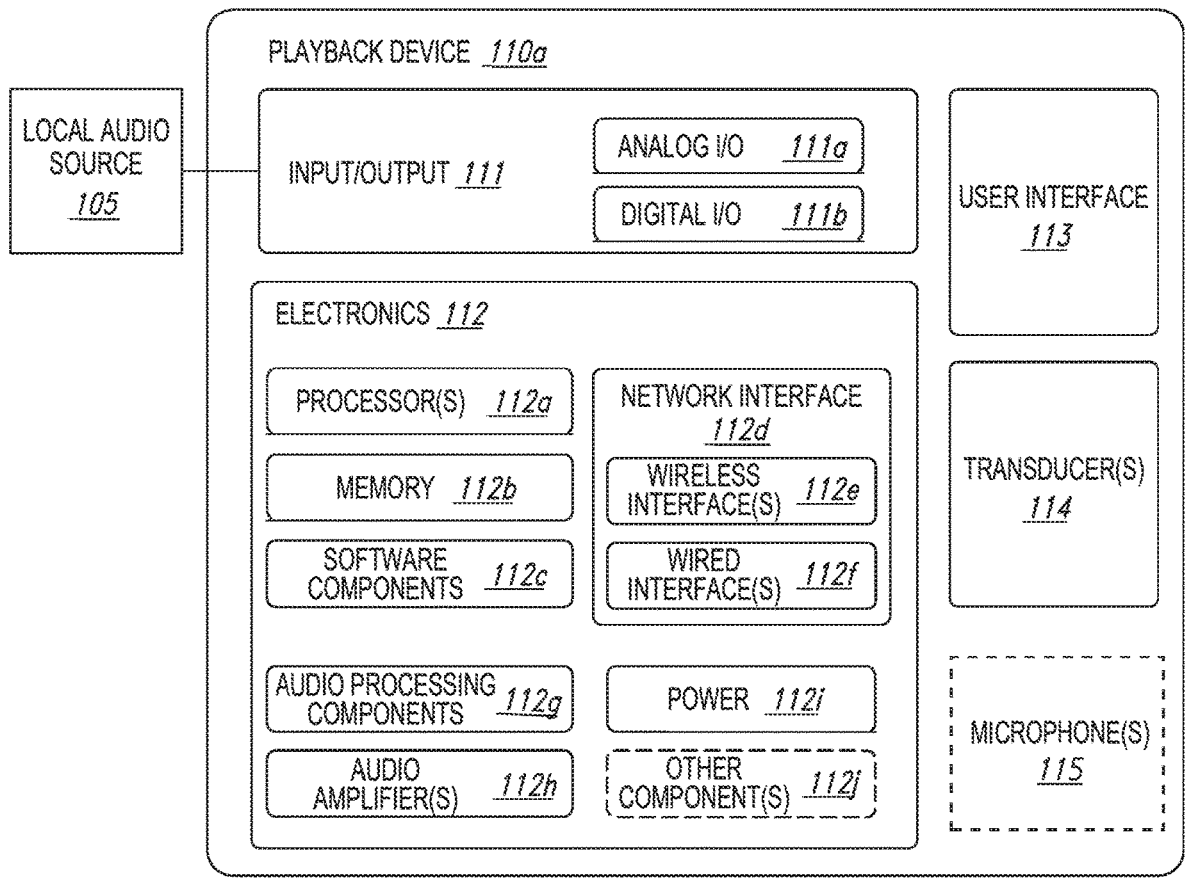
FIG. 1C is a block diagram of a playback device.

FIG. 1C is a block diagram of the playback device 110*a* comprising an input/output 111. The input/output 111 can include an analog I/O 111*a* (e.g., one or more wires, cables, and/or other suitable communication links configured to carry analog signals) and/or a digital I/O 111*b* (e.g., one or more wires, cables, or other suitable communication links configured to carry digital signals). In some embodiments, the analog I/O 111*a* is an audio line-in input connection comprising, for example, an auto-detecting 3.5 mm audio line-in connection. In some embodiments, the digital I/O 111*b* comprises a Sony/Philips Digital Interface Format (S/PDIF) communication interface and/or cable and/or a Toshiba Link (TOSLINK) cable. In some embodiments, the digital I/O 111*b* comprises an High-Definition Multimedia Interface (HDMI) interface and/or cable. In some embodiments, the digital I/O 111*b* includes one or more wireless communication links comprising, for example, a radio frequency (RF), infrared, WiFi, Bluetooth, or another suitable communication protocol. In certain embodiments, the analog I/O 111*a* and the digital I/O 111*b* comprise interfaces (e.g., ports, plugs, jacks) configured to receive connectors of cables transmitting analog and digital signals, respectively, without necessarily including cables.

The playback device 110*a*, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110a does not include an input/output 111 and receives all audio content via the network 104.

The playback device 110a further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106a-c via the network 104 (FIG. 1B), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

By way of illustration, SONOS, Inc. presently offers (or has offered) for sale certain playback devices including, for example, a "SONOS ONE," "PLAY:1," "PLAY:3," "PLAY: 5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). The headphone may comprise a headband coupled to one or more earcups. For example, a first earcup may be coupled to a first end of the headband and a second earcup may be coupled to a second end of the headband that is opposite the first end. Each of the one or more earcups may house any portion of the electronic components in the playback device, such as one or more transducers. Further, the one or more of earcups may include a user interface for controlling operation of the headphone such as for controlling audio playback, volume level, and other functions. The user interface may include any of a variety of control elements such as buttons, knobs, dials, touch-sensitive surfaces, and/or touchscreens. An ear cushion may be coupled each of the one or more earcups. The ear cushions may provide a soft barrier between the head of a user and the one or more earcups to improve user comfort and/or provide acoustic isolation from the ambient (e.g., provide passive noise reduction (PNR)). Additionally (or alternatively), the headphone may employ active noise reduction (ANR) techniques to further reduce the user's perception of outside noise during playback.

Figure 1D:
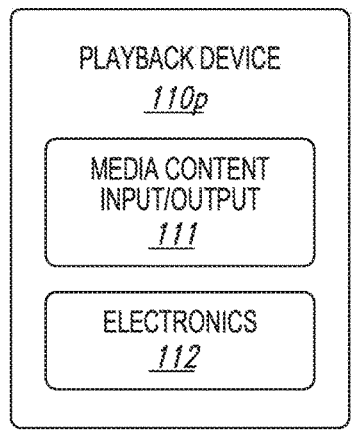
FIG. 1D is a block diagram of a playback device.

In some embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
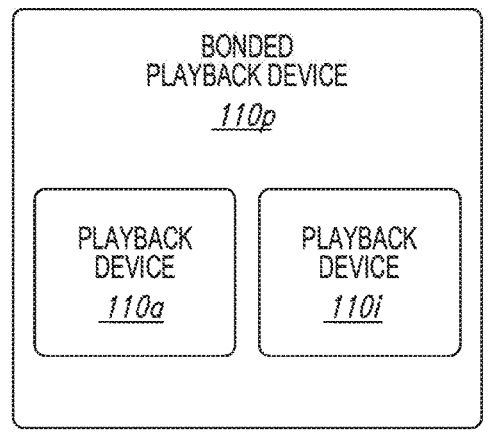
FIG. 1E is a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content. In some aspects, the playback device 110a, when bonded with the first playback device, is configured to render only the mid-range and high frequency components of a particular audio content, while the playback device 110i renders the low frequency component of the particular audio content. In some embodiments, the bonded playback device 110q includes additional playback devices and/or another bonded playback device. Additional playback device embodiments are described in further detail below with respect to FIGS. 2A-3D.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the amplifiers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other embodiments, however, the playback device 110r receives commands from another control device (e.g., the control device 130a of FIG. 1B). "Additional NMD embodiments are described in further detail below with respect to FIGS. 3A-3F."

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home. Additional description regarding receiving and processing voice input data can be found in further detail below with respect to FIGS. 3A-3F.

d. Suitable Control Devices

FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the media playback system 100. In other embodiments, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 302 to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some embodiments, the network interface 132 is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 304 to one or more of the playback devices 100. The network interface 132d can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among others. Additional description of zones and groups can be found below with respect to FIGS. 1-I through 1M.

The user interface 133 is configured to receive user input and can facilitate 'control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as a playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones.

e. Suitable Playback Device Configurations

FIGS. 1-I through 1M show example configurations of playback devices in zones and zone groups. Referring first to FIG. 1M, in one example, a single playback device may belong to a zone. For example, the playback device 110g in the second bedroom 101c (FIG. 1A) may belong to Zone C. In some implementations described below, multiple playback devices may be "bonded" to form a "bonded pair" which together form a single zone. For example, the playback device 110l (e.g., a left playback device) can be bonded to the playback device 110m (e.g., a right playback device) to form Zone B. Bonded playback devices may have different playback responsibilities (e.g., channel responsibilities). In another implementation described below, multiple playback devices may be merged to form a single zone. For example, the playback device 110h (e.g., a front playback device) may be merged with the playback device 110i (e.g., a subwoofer), and the playback devices 110j and 110k (e.g., left and right surround speakers, respectively) to form a single Zone D. In another example, the playback devices 110g and 110h can be merged to form a merged group or a zone group 108b. The merged playback devices 110g and 110h may not be specifically assigned different playback responsibilities. That is, the merged playback devices 110h and 110i may, aside from playing audio content in synchrony, each play audio content as they would if they were not merged.

Each zone in the media playback system 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom.

Playback devices that are bonded may have different playback responsibilities, such as responsibilities for certain audio channels. For example, as shown in FIG. 1-I, the playback devices 110l and 110m may be bonded so as to produce or enhance a stereo effect of audio content. In this example, the playback device 110l may be configured to play a left channel audio component, while the playback device 110k may be configured to play a right channel audio component. In some implementations, such stereo bonding may be referred to as "pairing."

Figures 1I, 1J:
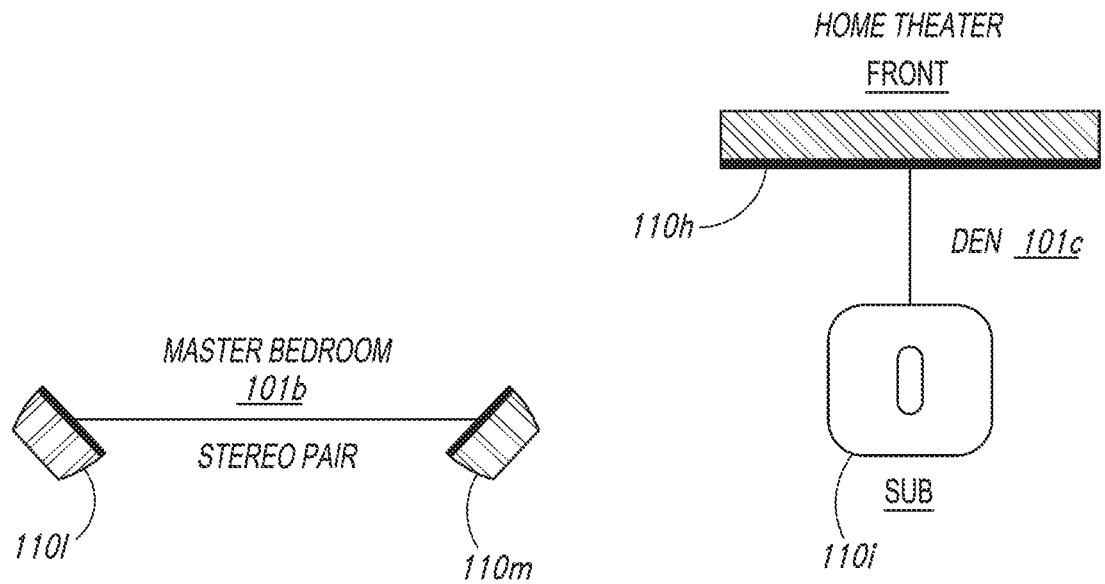
FIG. 1F is a block diagram of a network microphone device.
FIG. 1G is a block diagram of a playback device.
FIG. 1H is a partially schematic diagram of a control device.
FIGS. 1-I, 1J, 1K, and 1L are schematic diagrams of corresponding media playback system zones.
FIG. 1M is a schematic diagram of media playback system areas.
Figures 1K, 1L:
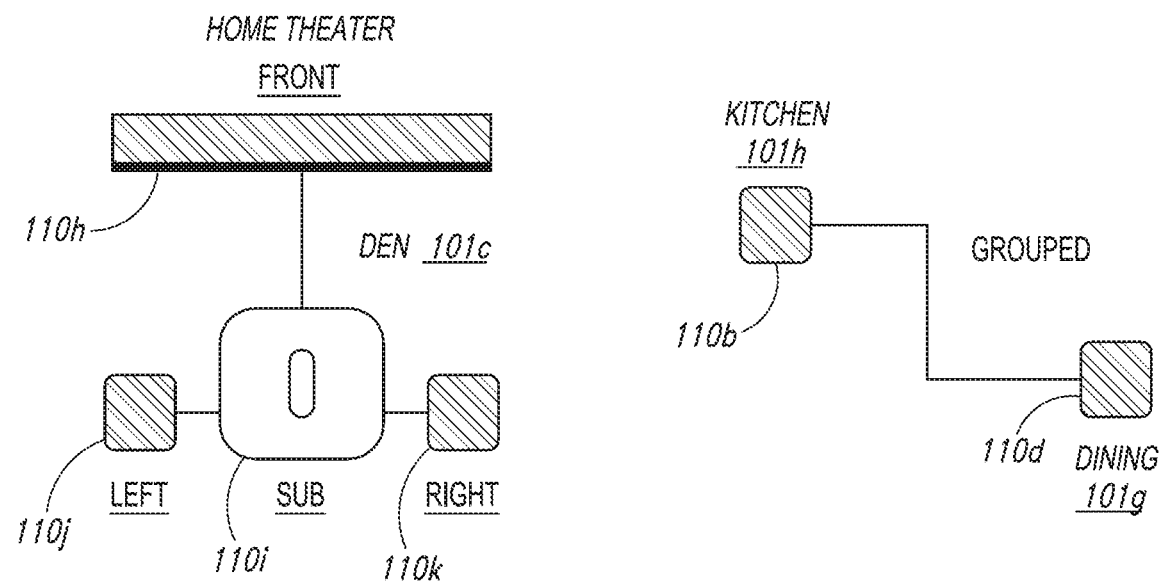
Figure 1M:
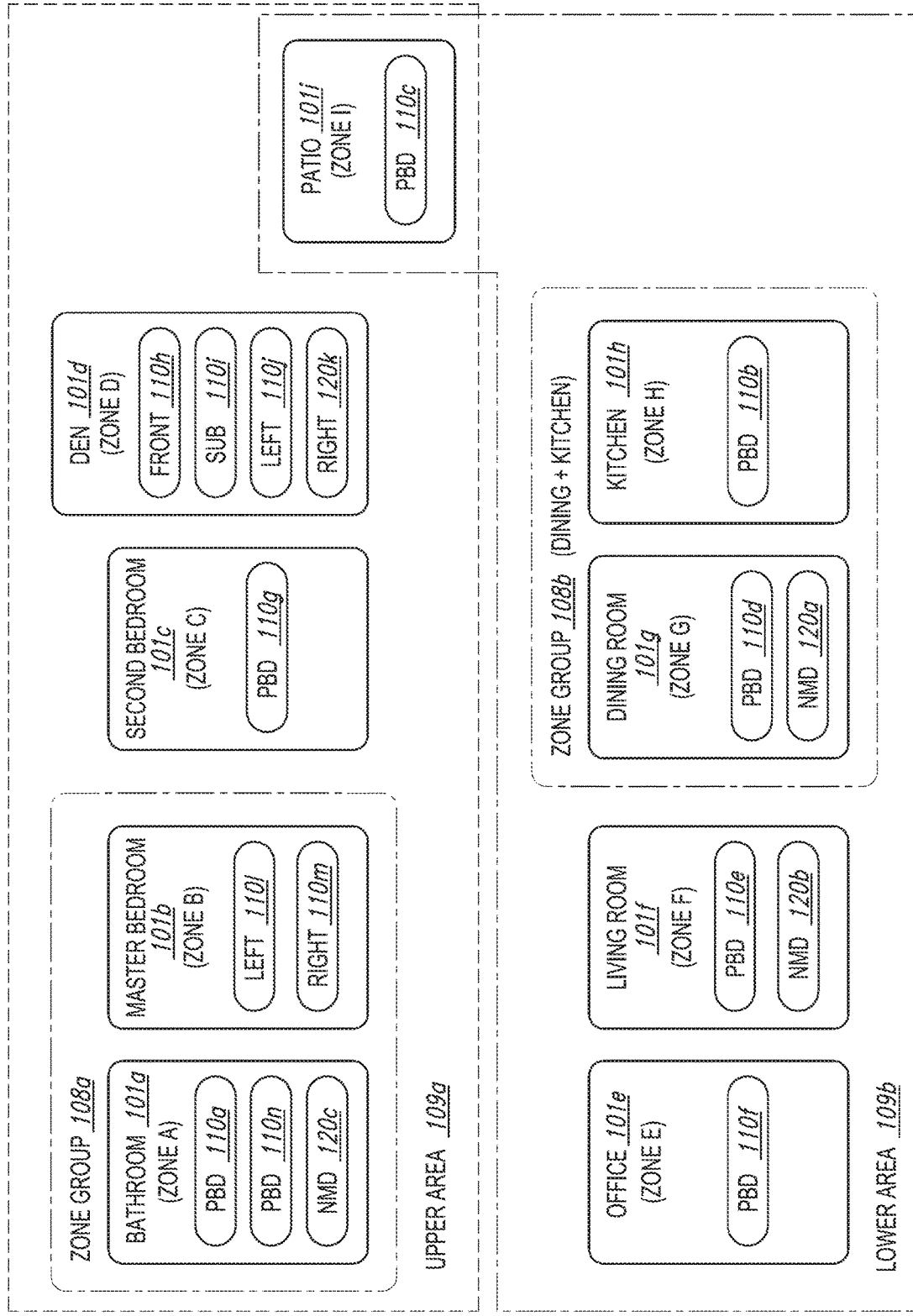

Additionally, bonded playback devices may have additional and/or different respective speaker drivers. As shown in FIG. 1J, the playback device 110h named Front may be bonded with the playback device 110i named SUB. The Front device 110h can be configured to render a range of mid to high frequencies and the SUB device 110i can be configured render low frequencies. When unbonded, however, the Front device 110h can be configured render a full range of frequencies. As another example, FIG. 1K shows the Front and SUB devices 110h and 110i further bonded with Left and Right playback devices 110j and 110k, respectively. In some implementations, the Right and Left devices 110j and 102k can be configured to form surround or "satellite"

channels of a home theater system. The bonded playback devices 110h, 110i, 110j, and 110k may form a single Zone D (FIG. 1M).

Playback devices that are merged may not have assigned playback responsibilities, and may each render the full range of audio content the respective playback device is capable of. Nevertheless, merged devices may be represented as a single UI entity (i.e., a zone, as discussed above). For instance, the playback devices 110a and 110n in the master bathroom have the single UI entity of Zone A. In one embodiment, the playback devices 110a and 110n may each output the full range of audio content each respective playback devices 110a and 110n are capable of, in synchrony.

In some embodiments, an NMD is bonded or merged with another device so as to form a zone. For example, the NMD 120b may be bonded with the playback device 110e, which together form Zone F, named Living Room. In other embodiments, a stand-alone network microphone device may be in a zone by itself. In other embodiments, however, a stand-alone network microphone device may not be associated with a zone. Additional details regarding associating network microphone devices and playback devices as designated or default devices may be found, for example, in previously referenced U.S. patent application Ser. No. 15/438,749.

Zones of individual, bonded, and/or merged devices may be grouped to form a zone group. For example, referring to FIG. 1M, Zone A may be grouped with Zone B to form a zone group 108a that includes the two zones. Similarly, Zone G may be grouped with Zone H to form the zone group 108b. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234, 395. Playback devices may be dynamically grouped and ungrouped to form new or different groups that synchronously play back audio content.

In various implementations, the zones in an environment may be the default name of a zone within the group or a combination of the names of the zones within a zone group. For example, Zone Group 108b can have be assigned a name such as "Dining+Kitchen", as shown in FIG. 1M. In some embodiments, a zone group may be given a unique name selected by a user.

Certain data may be stored in a memory of a playback device (e.g., the memory 112c of FIG. 1C) as one or more state variables that are periodically updated and used to describe the state of a playback zone, the playback device(s), and/or a zone group associated therewith. The memory may also include the data associated with the state of the other devices of the media system, and shared from time to time among the devices so that one or more of the devices have the most recent data associated with the system.

In some embodiments, the memory may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the second bedroom 101c may indicate that the playback device is the only playback device of the Zone C and not in a zone group. Identifiers associated with the Den may indicate that the Den is not grouped with other zones but includes bonded playback devices 110h-110k. Identifiers associated with the Dining Room may indicate that the Dining Room is part of the Dining+Kitchen zone group 108b and that devices 110b and 110d are grouped (FIG. 1L). Identifiers associated with the Kitchen may indicate the same or similar information by virtue of the Kitchen being part of the Dining+Kitchen zone group 108b. Other example zone variables and identifiers are described below.

In yet another example, the media playback system 100 may variables or identifiers representing other associations of zones and zone groups, such as identifiers associated with Areas, as shown in FIG. 1M. An area may involve a cluster of zone groups and/or zones not within a zone group. For instance, FIG. 1M shows an Upper Area 109a including Zones A-D, and a Lower Area 109b including Zones E-I. In one aspect, an Area may be used to invoke a cluster of zone groups and/or zones that share one or more zones and/or zone groups of another cluster. In another aspect, this differs from a zone group, which does not share a zone with another zone group. Further examples of techniques for implementing Areas may be found, for example, in U.S. application Ser. No. 15/682,506 filed Aug. 21, 2017 and titled "Room Association Based on Name," and U.S. Pat. No. 8,483,853 filed Sep. 11, 2007, and titled "Controlling and manipulating groupings in a multi-zone media system." Each of these applications is incorporated herein by reference in its entirety. In some embodiments, the media playback system 100 may not implement Areas, in which case the system may not store variables associated with Areas.

III. Example Systems and Devices

Figure 2A:
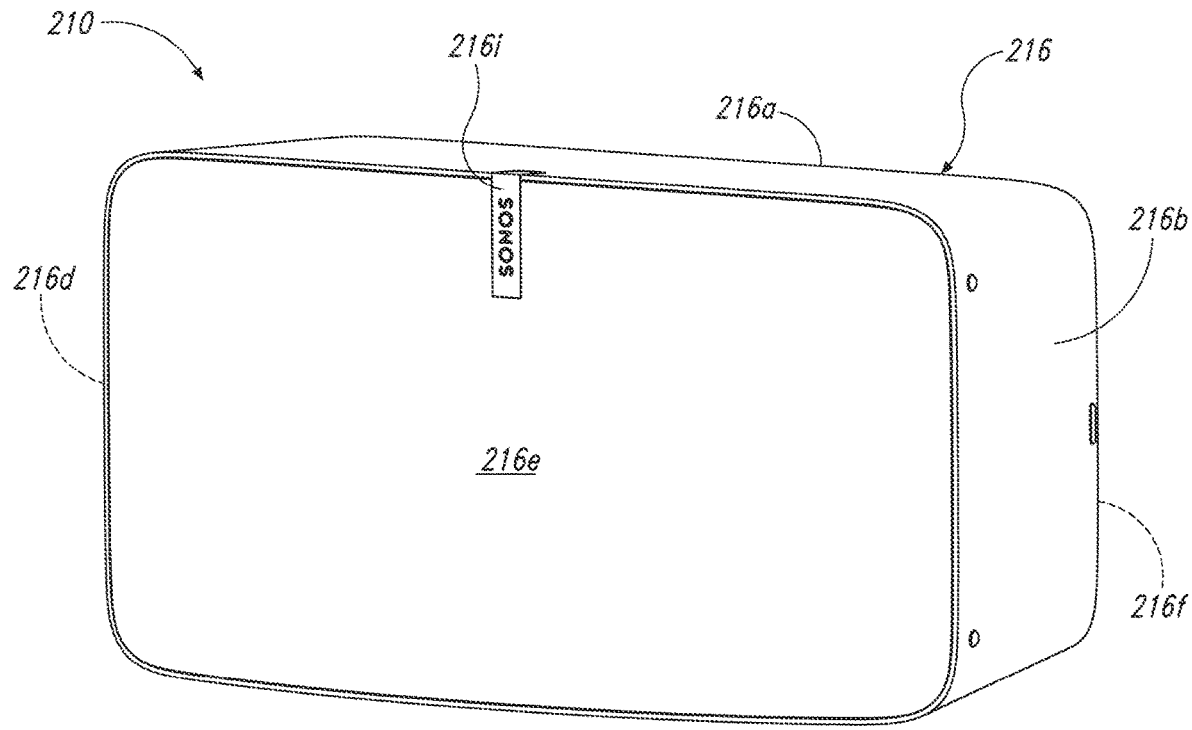
FIG. 2A is a front isometric view of a playback device configured in accordance with aspects of the disclosed technology.
Figure 2B:
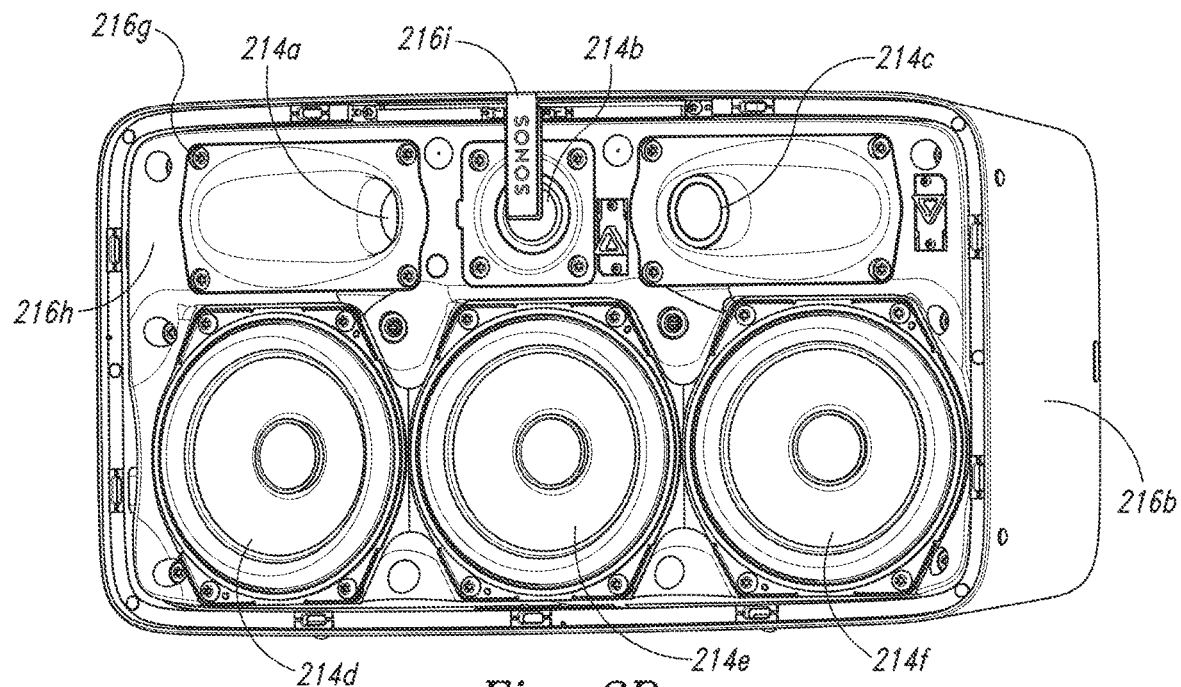
FIG. 2B is a front isometric view of the playback device of FIG. 2A without a grille.
Figure 2C:
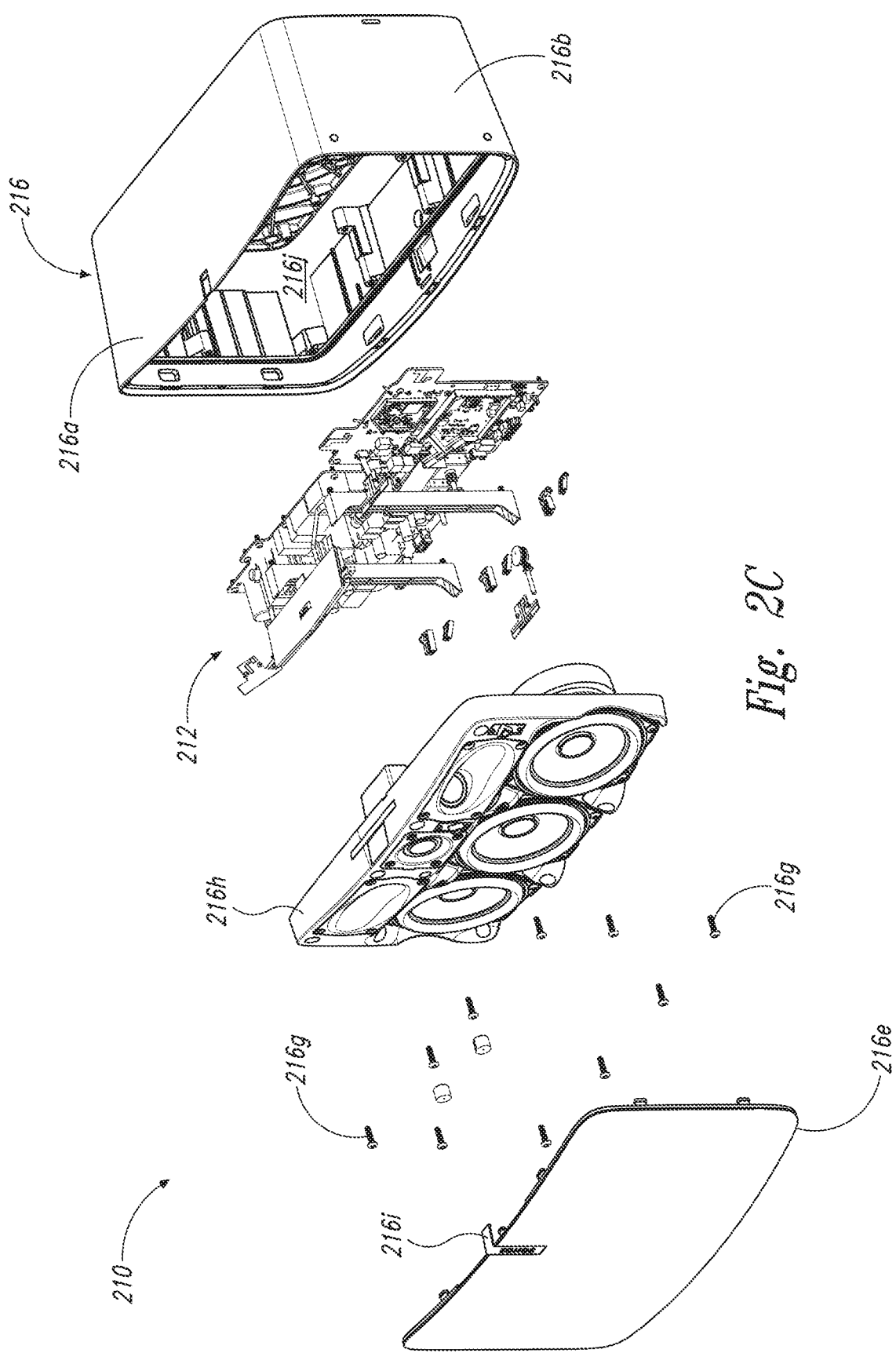
FIG. 2C is an exploded view of the playback device of FIG. 2A.

FIG. 2A is a front isometric view of a playback device 210 configured in accordance with aspects of the disclosed technology. FIG. 2B is a front isometric view of the playback device 210 without a grille 216e. FIG. 2C is an exploded view of the playback device 210. Referring to FIGS. 2A-2C together, the playback device 210 comprises a housing 216 that includes an upper portion 216a, a right or first side portion 216b, a lower portion 216c, a left or second side portion 216d, the grille 216e, and a rear portion 216f. A plurality of fasteners 216g (e.g., one or more screws, rivets, clips) attaches a frame 216h to the housing 216. A cavity 216j (FIG. 2C) in the housing 216 is configured to receive the frame 216h and electronics 212. The frame 216h is configured to carry a plurality of transducers 214 (identified individually in FIG. 2B as transducers 214a-f). The electronics 212 (e.g., the electronics 112 of FIG. 1C) is configured to receive audio content from an audio source and send electrical signals corresponding to the audio content to the transducers 214 for playback.

The transducers 214 are configured to receive the electrical signals from the electronics 112, and further configured to convert the received electrical signals into audible sound during playback. For instance, the transducers 214a-c (e.g., tweeters) can be configured to output high frequency sound (e.g., sound waves having a frequency greater than about 2 kHz). The transducers 214d-f (e.g., mid-woofers, woofers, midrange speakers) can be configured output sound at frequencies lower than the transducers 214a-c (e.g., sound waves having a frequency lower than about 2 kHz). In some embodiments, the playback device 210 includes a number of transducers different than those illustrated in FIGS. 2A-2C. For example, as described in further detail below with respect to FIGS. 3A-3C, the playback device 210 can include fewer than six transducers (e.g., one, two, three). In other embodiments, however, the playback device 210 includes more than six transducers (e.g., nine, ten). Moreover, in some embodiments, all or a portion of the transducers 214 are configured to operate as a phased array to desirably adjust (e.g., narrow or widen) a radiation pattern of the transducers 214, thereby altering a user's perception of the sound emitted from the playback device 210.

In the illustrated embodiment of FIGS. 2A-2C, a filter 216i is axially aligned with the transducer 214b. The filter 216i can be configured to desirably attenuate a predetermined range of frequencies that the transducer 214b outputs to improve sound quality and a perceived sound stage output collectively by the transducers 214. In some embodiments, however, the playback device 210 omits the filter 216i. In other embodiments, the playback device 210 includes one or more additional filters aligned with the transducers 214b and/or at least another of the transducers 214.

Figure 3A:
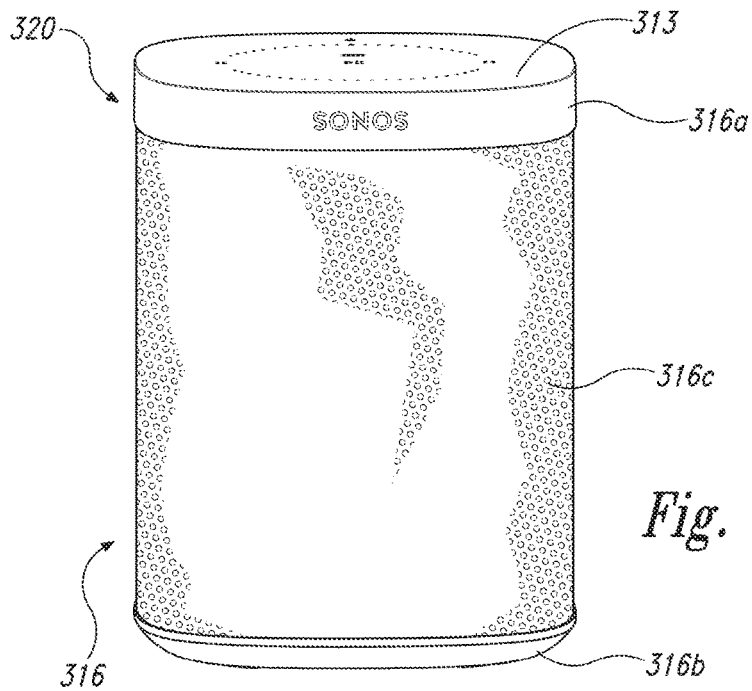
FIG. 3A is a front view of a network microphone device configured in accordance with aspects of the disclosed technology.
Figure 3B:
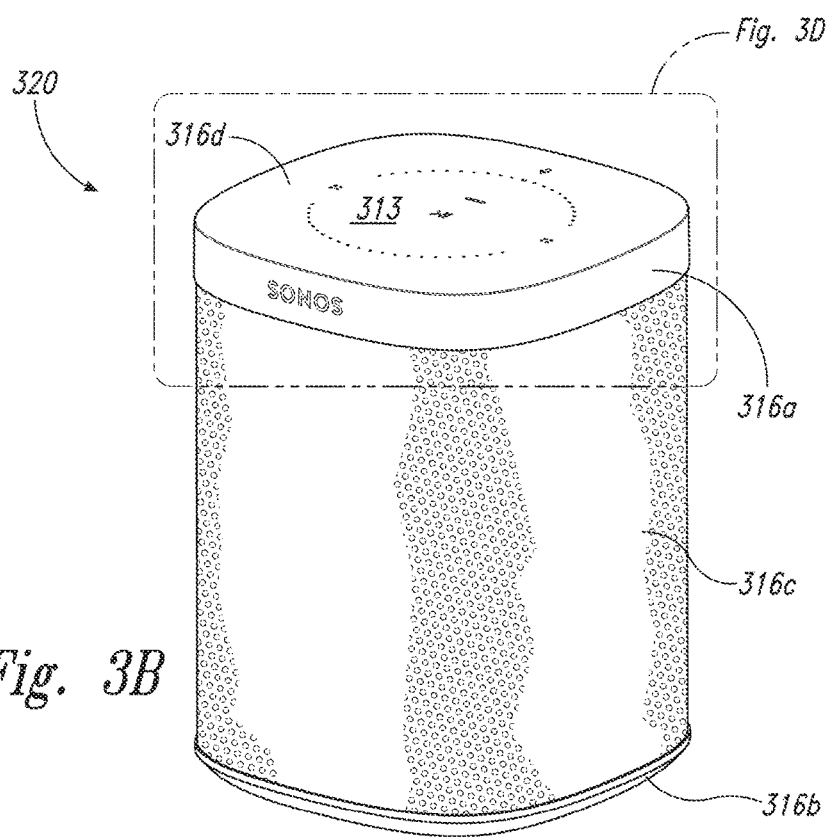
FIG. 3B is a side isometric view of the network microphone device of FIG. 3A.
Figure 3C:
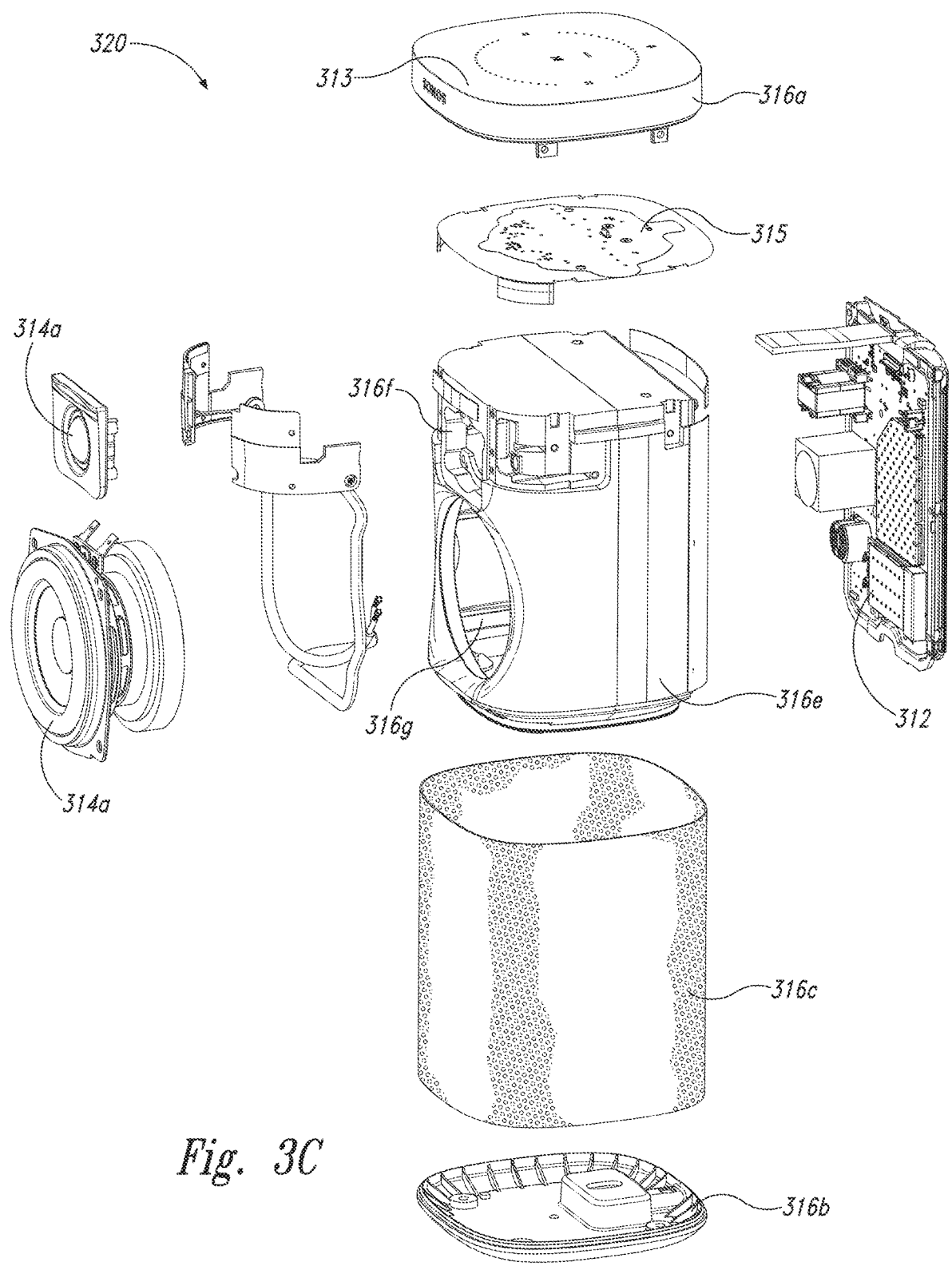
FIG. 3C is an exploded view of the network microphone device of FIGS. 3A and 3B.
Figure 3D:
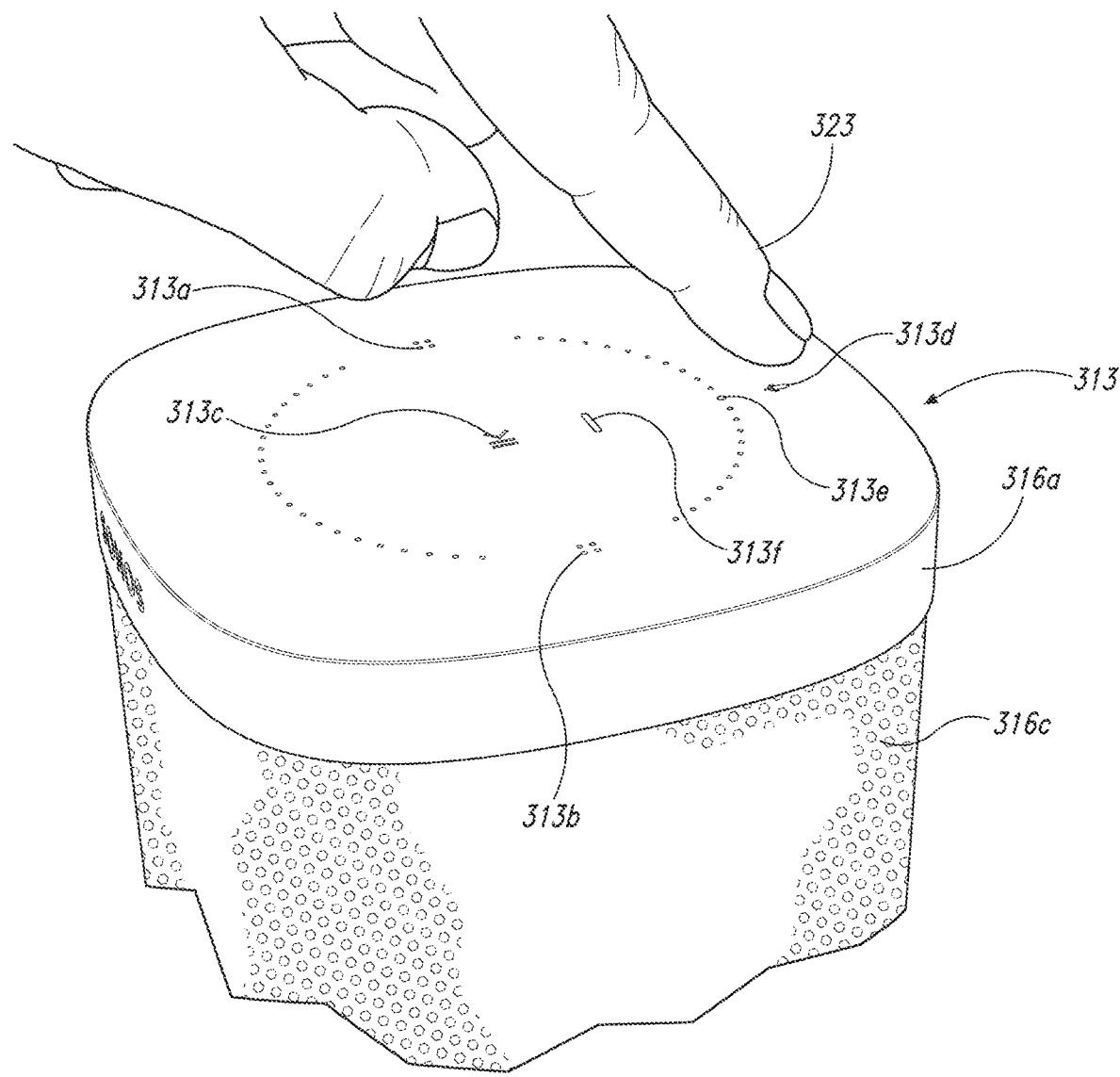
FIG. 3D is an enlarged view of a portion of FIG. 3B.

FIGS. 3A and 3B are front and right isometric side views, respectively, of an NMD 320 configured in accordance with embodiments of the disclosed technology. FIG. 3C is an exploded view of the NMD 320. FIG. 3D is an enlarged view of a portion of FIG. 3B including a user interface 313 of the NMD 320. Referring first to FIGS. 3A-3C, the NMD 320 includes a housing 316 comprising an upper portion 316a, a lower portion 316b and an intermediate portion 316c (e.g., a grille). A plurality of ports, holes or apertures 316d in the upper portion 316a allow sound to pass through to one or more microphones 315 (FIG. 3C) positioned within the housing 316. The one or more microphones 315 are configured to received sound via the apertures 316d and produce electrical signals based on the received sound. In the illustrated embodiment, a frame 316e (FIG. 3C) of the housing 316 surrounds cavities 316f and 316g configured to house, respectively, a first transducer 314a (e.g., a tweeter) and a second transducer 314b (e.g., a mid-woofer, a midrange speaker, a woofer). In other embodiments, however, the NMD 320 includes a single transducer, or more than two (e.g., two, five, six) transducers. In certain embodiments, the NMD 320 omits the transducers 314a and 314b altogether.

Electronics 312 (FIG. 3C) includes components configured to drive the transducers 314a and 314b, and further configured to analyze audio data corresponding to the electrical signals produced by the one or more microphones 315. In some embodiments, for example, the electronics 312 comprises many or all of the components of the electronics 112 described above with respect to FIG. 1C. In certain embodiments, the electronics 312 includes components described above with respect to FIG. 1F such as, for example, the one or more processors 112a, the memory 112b, the software components 112c, the network interface 112d, etc. In some embodiments, the electronics 312 includes additional suitable components (e.g., proximity or other sensors). Proximity sensors may comprise, for example, one or more sensors configured to detect movement such as accelerometers, gyroscopes, and/or inertial measurement units (IMUs).

Referring to FIG. 3D, the user interface 313 includes a plurality of control surfaces (e.g., buttons, knobs, capacitive surfaces) including a first control surface 313a (e.g., a previous control), a second control surface 313b (e.g., a next control), and a third control surface 313c (e.g., a play and/or pause control). A fourth control surface 313d is configured to receive touch input corresponding to activation and deactivation of the one or microphones 315. A first indicator 313e (e.g., one or more light emitting diodes (LEDs) or another suitable illuminator) can be configured to illuminate only when the one or more microphones 315 are activated. A second indicator 313f (e.g., one or more LEDs) can be configured to remain solid during normal operation and to blink or otherwise change from solid to indicate a detection of voice activity. In some embodiments, the user interface 313 includes additional or fewer control surfaces and illuminators. In one embodiment, for example, the user interface 313 includes the first indicator 313e, omitting the second indicator 313f. Moreover, in certain embodiments, the NMD 320 comprises a playback device and a control device, and the user interface 313 comprises the user interface of the control device.

Referring to FIGS. 3A-3D together, the NMD 320 is configured to receive voice commands from one or more adjacent users via the one or more microphones 315. As described above with respect to FIG. 1B, the one or more microphones 315 can acquire, capture, or record sound in a vicinity (e.g., a region within 10 m or less of the NMD 320) and transmit electrical signals corresponding to the recorded sound to the electronics 312. The electronics 312 can process the electrical signals and can analyze the resulting audio data to determine a presence of one or more voice commands (e.g., one or more activation words). In some embodiments, for example, after detection of one or more suitable voice commands, the NMD 320 is configured to transmit a portion of the recorded audio data to another device and/or a remote server (e.g., one or more of the computing devices 106 of FIG. 1B) for further analysis. The remote server can analyze the audio data, determine an appropriate action based on the voice command, and transmit a message to the NMD 320 to perform the appropriate action. For instance, a user may speak "Sonos, play Michael Jackson." The NMD 320 can, via the one or more microphones 315, record the user's voice utterance, determine the presence of a voice command, and transmit the audio data having the voice command to a remote server (e.g., one or more of the remote computing devices 106 of FIG. 1B, one or more servers of a VAS and/or another suitable service). The remote server can analyze the audio data and determine an action corresponding to the command. The remote server can then transmit a command to the NMD 320 to perform the determined action (e.g., play back audio content related to Michael Jackson). The NMD 320 can receive the command and play back the audio content related to Michael Jackson from a media content source. As described above with respect to FIG. 1B, suitable content sources can include a device or storage communicatively coupled to the NMD 320 via a LAN (e.g., the network 104 of FIG. 1B), a remote server (e.g., one or more of the remote computing devices 106 of FIG. 1B), etc. In certain embodiments, however, the NMD 320 determines and/or performs one or more actions corresponding to the one or more voice commands without intervention or involvement of an external device, computer, or server.

Figure 3E:
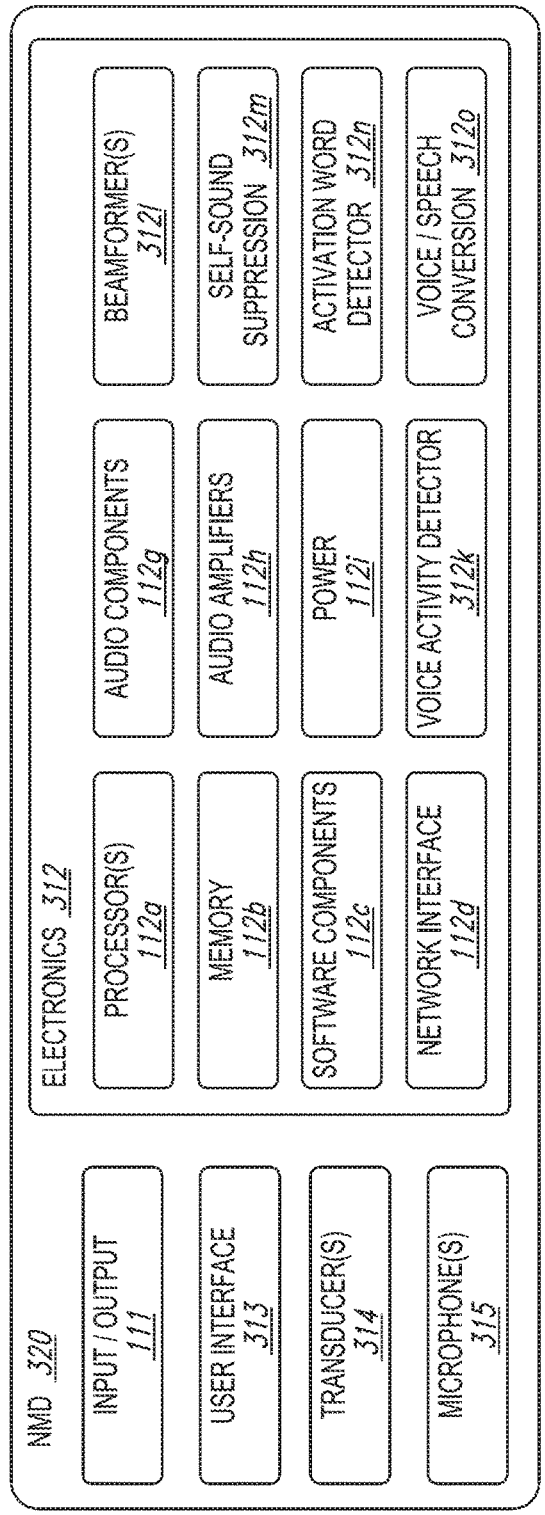
FIG. 3E is a block diagram of the network microphone device of FIGS. 3A-3D

FIG. 3E is a functional block diagram showing additional features of the NMD 320 in accordance with aspects of the disclosure. The NMD 320 includes components configured to facilitate voice command capture including voice activity detector component(s) 312k, beam former components 312l, acoustic echo cancellation (AEC) and/or self-sound suppression components 312m, activation word detector components 312n, and voice/speech conversion components 312o (e.g., voice-to-text and text-to-voice). In the illustrated embodiment of FIG. 3E, the foregoing components 312k-312o are shown as separate components. In some embodiments, however, one or more of the components 312k-312o are subcomponents of the processors 112a.

The beamforming and self-sound suppression components 312l and 312m are configured to detect an audio signal and determine aspects of voice input represented in the detected audio signal, such as the direction, amplitude, frequency spectrum, etc. The voice activity detector activity components 312k are operably coupled with the beamforming and AEC components 312l and 312m and are configured to determine a direction and/or directions from which voice activity is likely to have occurred in the detected audio signal. Potential speech directions can be identified by monitoring metrics which distinguish speech from other sounds. Such metrics can include, for example, energy within the speech band relative to background noise and entropy within the speech band, which is measure of spectral structure. As those of ordinary skill in the art will appreciate, speech typically has a lower entropy than most common background noise.

The activation word detector components 312n are configured to monitor and analyze received audio to determine if any activation words (e.g., wake words) are present in the received audio. The activation word detector components 312n may analyze the received audio using an activation word detection algorithm. If the activation word detector 312n detects an activation word, the NMD 320 may process voice input contained in the received audio. Example activation word detection algorithms accept audio as input and provide an indication of whether an activation word is present in the audio. Many first- and third-party activation word detection algorithms are known and commercially available. For instance, operators of a voice service may make their algorithm available for use in third-party devices. Alternatively, an algorithm may be trained to detect certain activation words. In some embodiments, the activation word detector 312n runs multiple activation word detection algorithms on the received audio simultaneously (or substantially simultaneously). As noted above, different voice services (e.g. AMAZON's ALEXA®, APPLE's SIRI®, or MICROSOFT's CORTANA®) can each use a different activation word for invoking their respective voice service. To support multiple services, the activation word detector 312n may run the received audio through the activation word detection algorithm for each supported voice service in parallel.

The speech/text conversion components 312o may facilitate processing by converting speech in the voice input to text. In some embodiments, the electronics 312 can include voice recognition software that is trained to a particular user or a particular set of users associated with a household. Such voice recognition software may implement voice-processing algorithms that are tuned to specific voice profile(s). Tuning to specific voice profiles may require less computationally intensive algorithms than traditional voice activity services, which typically sample from a broad base of users and diverse requests that are not targeted to media playback systems.

Figure 3F:
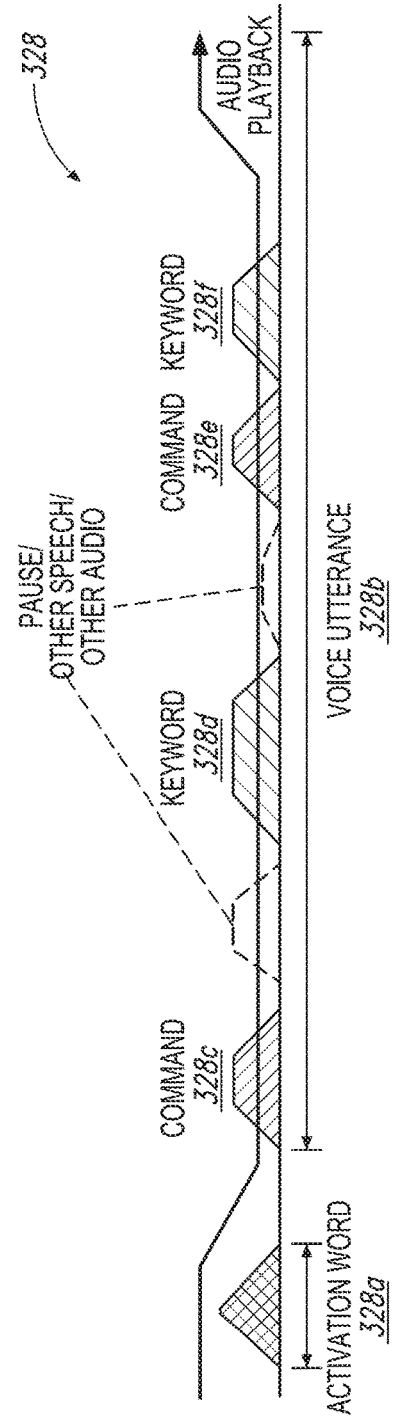
FIG. 3F is a schematic diagram of an example voice input.

FIG. 3F is a schematic diagram of an example voice input 328 captured by the NMD 320 in accordance with aspects of the disclosure. The voice input 328 can include a activation word portion 328a and a voice utterance portion 328b. In some embodiments, the activation word 557a can be a known activation word, such as "Alexa," which is associated with AMAZON's ALEXA®. In other embodiments, however, the voice input 328 may not include a activation word. In some embodiments, a network microphone device may output an audible and/or visible response upon detection of the activation word portion 328a. In addition or alternately, an NMD may output an audible and/or visible response after processing a voice input and/or a series of voice inputs.

The voice utterance portion 328b may include, for example, one or more spoken commands (identified individually as a first command 328c and a second command 328e) and one or more spoken keywords (identified individually as a first keyword 328d and a second keyword 328f). In one example, the first command 328c can be a command to play music, such as a specific song, album, playlist, etc. In this example, the keywords may be one or words identifying one or more zones in which the music is to be played, such as the Living Room and the Dining Room shown in FIG. 1A. In some examples, the voice utterance portion 328b can include other information, such as detected pauses (e.g., periods of non-speech) between words spoken by a user, as shown in FIG. 3F. The pauses may demarcate the locations of separate commands, keywords, or other information spoke by the user within the voice utterance portion 328b.

In some embodiments, the media playback system 100 is configured to temporarily reduce the volume of audio content that it is playing while detecting the activation word portion 557a. The media playback system 100 may restore the volume after processing the voice input 328, as shown in FIG. 3F. Such a process can be referred to as ducking, examples of which are disclosed in U.S. patent application Ser. No. 15/438,749, incorporated by reference herein in its entirety.

IV. Example Allocation of Audio Based on Retrieved Configuration Information In the discussion below, reference is made herein to "portable devices" including "portable playback devices" and "portable network microphone devices." Such "portable devices" may be devices that comprise an internal power source (e.g., one or more batteries). On the other hand, "stationary devices," such as "stationary playback devices" and "stationary network microphone devices," may be devices that operate using an external power source, although such devices may in fact be moved around a home or other environment. Further, a "playback device associated with a room" may be a playback device which is intended to remain in substantially the same position after configuration. The reference to "room" in this context is not limited only to rooms but is used to refer an associated playback location may not be a room in a conventional sense, such as a patio or a deck, or be a combination of two or physical rooms.

In certain examples, audio is allocated automatically in response to a trigger based on retrieved configuration information. The configuration information in these examples comprises one or more state variables which are either stored locally on a playback device or a control device, retrieved from another playback device or control device, or retrieved from a remote server system such as a server system accessible via the internet. By using the configuration information, data of the current playback system configuration can be determined audio portions can be allocated amongst speakers in a more intuitive and easier to use way, with minimal or no user interaction required. Such automatic allocation is beneficial when playback devices are moved, because the configuration of the playback system as a whole may be required to be updated following the movement. This is particularly the case for playback devices which are designed to be portable and moved to different locations.

Figure 4:
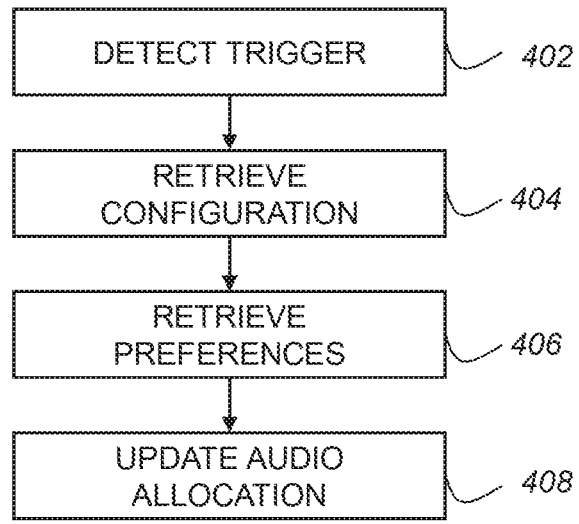
FIG. 4 is a flow chart of an example method of updating allocation of audio to playback devices that can be used with, for example, the media playback system of FIG. 1B.

Referring now to FIG. 4, a method is disclosed in which audio allocations are updated automatically in response to a trigger. The method can be implemented by a playback device and/or a control device as discussed above. First, at block 402, a trigger is detected. The trigger can take several forms. For example, it may be a received input, such as a voice input, an input received via a user interface, a touch screen display, or a button press using a button on a playback device or control device. Where the trigger is a button press, a long button press—in which a button is held pressed for a predetermined time such as 1, 2 or 3 seconds—may be distinguished from shorter button presses. A long button press may be determined as a trigger while shorter button presses carry out the usual function of the button, such as play/pause. The trigger may also be an event indicating that the playback device is (or is not) in proximity to another device (e.g., another playback device, a control device, etc.). Examples of such triggers indicating proximity (or lack of proximity) include the establishment or disestablishment of a wireless connection, such as establishing a Near Field Communication (NFC) or Bluetooth® connection with another playback device and/or control device or detecting a Bluetooth® beacon (e.g., a Bluetooth® low energy (BLE) beacon) emitted by another playback device and/or control device.

As described herein, the trigger may take the form of an event indicating proximity (or loss of proximity) to another device (e.g., another playback device, a control device, etc.). Any of a variety of components in the playback device may be employed to detect such an event including, for example, network interface component(s) (e.g., detect the establishment/disestablishment of a wireless connection, detect a wireless beacon emitted by another device, etc.), sensor(s) configured to detect movement (e.g., accelerometers, gyroscopes, IMUS, etc.), and/or microphones (e.g., to detect acoustic waves emitted by another device). In some embodiments, the trigger event indicating proximity (or loss of proximity) may be based on the output of multiple different sensors and/or a sequence of outputs from the multiple different sensors. For example, the trigger event indicating that the playback device is proximate another device may first require that the playback device detects that the playback device was moved (e.g., based on the output of a sensor configured to detect movement). Then, after the movement is detected, the trigger event may require that the playback device initiate (and pass) a proximity test with the other device. Conversely, the trigger event indicating that the playback device is not proximate another device may first require that the playback device detects that the playback device was moved (e.g., based on the output of a sensor configured to detect movement). Then, after the movement is detected, the trigger event may require that the playback device initiate (and fail) a proximity test with the other device.

The proximity test may take a variety of forms. For example, the proximity test may involve transmission of a wireless signal between the playback device and the other playback device. In this example, the proximity test with the other device may be passed when the wireless signal is detected by one of the playback device and the other playback device in accordance with one or more criteria indicative of proximity (e.g., the detected wireless signal has a signal strength above a threshold). Otherwise, the proximity test with the other device may fail. In another example, the proximity test may involve transmission of an acoustic signal (e.g., an ultrasonic signal) between the playback device and the other playback device. In this example, the proximity test with the other device may be passed when the acoustic signal is detected by one of the playback device and the other playback device in accordance with one or more criteria indicative of proximity (e.g., the detected acoustic signal has a signal strength above a threshold). Otherwise, the proximity test with the other device may fail. Additional techniques for proximity detection using acoustic waves are described in U.S. Patent Publication No. 2019/0253154, published on Aug. 15, 2019, titled "Method and System for Acoustic Communication of Data" and U.S. Patent Publication No. 2019/0237091, published on Aug. 1, 2019, titled "A Method and System for Acoustic Communication of Data," each of which is incorporated herein by reference in its entirety.

Once the trigger has been detected, the method proceeds to block 404, where configuration information is retrieved. By retrieving configuration information, the status of other devices in the playback system can be determined to influence how the audio portions are allocated to playback devices. The configuration information may be saved as one or more state variables which are shared amongst playback devices and control devices forming the playback system. The state variables may be stored as a single data structure or stored as multiple data structures. Various information may be obtained from the configuration information including one or more of:

- The identifies of devices in the system, both at a network level such as a MAC address or IP address, and at a higher level, such as a name assigned to the device by a user, or automatically assigned when the system was first set up. For example, the configuration information may store that devices 110*l* and 110*m* both have the name "Master Bedroom";
- Current grouping status of devices and the allocations of audio assigned to the devices. For example the configuration information may indicate that devices 110*l* and 110*m* are bonded as left and right speakers of a stereo pair and further grouped with 110*a* for synchronous playback;
- Current playback status, including any media being reproduced and a position within the media;
- Group coordinators for any groups of devices. A group coordinator is a device which is responsible for coordinating playback within the group of devices (e.g., group members). It may also be responsible for sourcing and distributing media data to the devices in the group;
- Playback queues associated with playback devices and/or groups; and
- An orientation of one or more of the playback devices (e.g., for playback devices that support playback in multiple orientations such as a horizontal orientation where the playback device lays horizontally on a surface and a vertical orientation where the playback device sits vertically on a surface).

Next, at block 406 user preferences are retrieved (e.g., retrieved from memory or obtained from a user via an interface). These preferences may be stored as part of the configuration information or separately. The preference information can be shared amongst devices in a similar way to the configuration information and stored locally or remotely. Preference data may indicate preferences to be applied to playback system as a whole, or preferences which are specific to a particular user. Where preferences are specific to a particular user, they may be stored on a control device associated with the user or only retrievable with credentials associated with the user. Example preferences include preferences for primary devices to provide voice assistant feedback and preferences for automatic audio allocation (e.g., when playback devices are grouped or ungrouped automatically, how playback devices are grouped such as whether the playback devices playback the same audio channels or playback a subset (e.g., form a stereo pair), etc.). In instances where a user has not specified a particular preference, a default preference may be employed.

As mentioned above, the retrieval of the user preference may comprise requesting input from the user (e.g., via an interface on the playback device or a control device in communication with the playback device). In some embodiments, the playback device may cause a graphical user interface (GUI) on a control device to be modified to present one or more playback options to a user. Examples of playback options that may be presented to the user include: (1) an option to stereo pair two or more playback devices; (2) an option to unpair two stereo paired playback devices; (3) an option to group two or more playback devices; and (4) an option to ungroup two or more options. In turn, the selection (and/or absence of selection) of a given playback option by the user (as detected by the control device) may be transmitted from the control device to the playback device (e.g., as user preference information).

Figure 7A:
FIG. 7A is an example screen of a graphical user interface displayed by a control device.
Figure 7B:
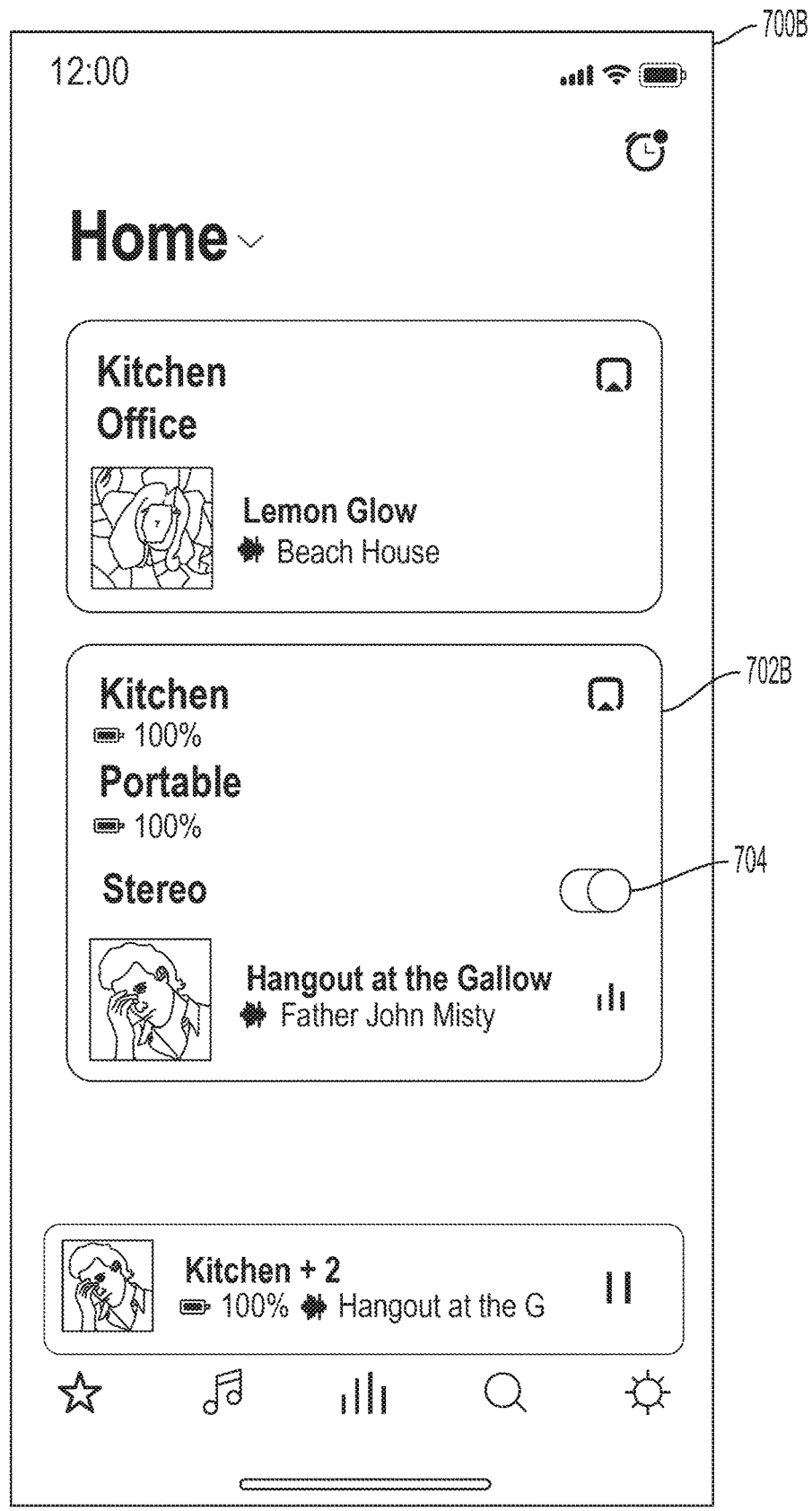
FIG. 7B is another example screen of a graphical interface displayed by a control device.

The GUI of the control device may be updated in any of a variety of ways to obtain input from a user regarding the preferences of the user. FIGS. 7A and 7B show an example of such a GUI that may be employed to obtain input from a user regarding a preference of how audio channels should be distributed between two playback devices (e.g., portable playback devices) that have been brought in proximity with each other (e.g., proximity identified as part of the trigger in block 402).

FIG. 7A shows an example screen 700A of a GUI presented by the control device when two playback devices are grouped together for synchronous playback and reproduce the same audio channels (e.g., both players reproduce the left and right audio channels). In particular, the screen 700A includes a region 702A that shows: (1) the players the grouped together for synchronous playback (e.g., Kitchen and Portable); (2) a battery state of those players in the group that are battery powered portable players (e.g., Kitchen and Portable); and (3) metadata regarding the media currently being played back (e.g., album art, artist, audio track name, etc.).

After a playback device in the synchrony group (e.g., Kitchen and/or Portable in screen 700A) detects that the playback device has come in proximity to the other playback device in the group (e.g., proximity identified as part of the trigger in block 402), the playback device may (e.g., as part of retrieving preference information in block 406) cause the GUI shown on the control device to be updated from screen 700A in FIG. 7A to screen 700B in FIG. 7B. For example, the transition from screen 700A to 700B may be caused by transmission (e.g., by the playback device) of at least one message to the control device indicating that two playback devices playing back audio in synchrony have come into proximity of each other. Relative to the screen 700A, the screen 700B updates the region 702A to 702B by adding at least one playback option shown as a selectable slider 704. Upon activation of the selectable slider 704 (e.g., by a user), the playback devices in the group (e.g., Kitchen and Portable) may form a stereo pair (e.g., a left channel is assigned to Kitchen and a right channel is assigned to Portable or vice versa). For example, the control device may detect activation of the slider 704 and transmit at least one message to the playback devices indicating a request from the user to stereo pair the two playback devices has been detected. In this example, the playback device may use such preference information from the user in block 408 of updating the audio allocation between the two playback devices (e.g., so as to form a stereo pair by assigning a left channel to one playback device in the group and a right channel to another playback device in the group).

Once the configuration information and preference information have been retrieved, the audio allocation is updated out block 408. Updating the audio allocation may comprise one or more of the following: (1) updating a distribution of audio portions (e.g., audio channels, frequency ranges, etc.) between playback devices; (2) updating one or more equalization settings of one or more playback devices; and/or (3) updating which playback device(s) are designated as a group coordinator (e.g., change the mode of operation of one or more of the playback devices from a group coordinator mode to a group member mode or from a group member mode to a group coordinator mode). The audio allocation can be updated in various ways and can be further based on the retrieved preference information and the nature of the trigger itself. As a result, the audio allocation may be updated based on any combination of the following: (1) the trigger, (2) the configuration information, and (3) the preference information. It should be appreciated that, in some embodiments, preference information may be omitted altogether. In such embodiments, the method 400 may omit block 406 of retrieving user preferences.

As mentioned above, updating the audio allocation may comprise updating one or more equalization settings of one or more of the playback devices. Examples of equalization settings that may be updated include one or more of: (1) bass level; (2) mid-range level; (3) treble level; (4) left-right balance; and (5) front-rear balance. The equalization settings of one or more of the playback devices may be updated in any of a variety of ways. In some embodiments, a playback device may update equalization settings by playing audio and detecting the sound (e.g., reflected from objects in the environment during playback of the audio) using one or more microphones in the playback device (or another device such as a control device). The playback device (and/or a control device) may analyze the sound to gain insights regarding the acoustics of the environment and modify the equalization settings to suit the acoustics of the environment as described in U.S. Pat. No. 9,219,460, issued Dec. 22, 2015, titled "Audio Settings based on Environment," which is hereby incorporated herein by reference in its entirety.

It should be appreciated that, in some instances, the playback device may modify the equalization settings as part of updating the audio allocation after detection of only certain trigger events. For example, the playback device may perform a routine to update one or more equalization settings after detection of a first set of trigger events (e.g., detection of movement and/or proximity to another device) and not after detection of a second, different set of trigger events (e.g., detected voice input). Thus, the playback device may, in these certain instances, only modify the equalization settings after detection of a trigger indicating that the environment in which the playback device is operating has changed (e.g., the playback device has been moved within a room). Otherwise, the playback device may continue to use the same equalization settings. In other instances, the playback device may update the one or more equalization settings after detection of any trigger event.

Examples of updating the audio allocation based on various different combinations of configuration information, preference information and trigger will now be set out. Other examples are also possible, playback system may implement some or all of these automatic allocations.

Examples of Grouping Devices and Allocating Audio Based on Configuration Information Example 1: Trigger: A trigger is detected which is associated with a portable playback device. The trigger can be an input in a control application, a wireless communication connection being established between the portable playback device and a second playback device associated with a room, or a long button press on the portable playback device. Configuration information: the configuration information shows that the portable playback device is not currently reproducing media. Audio allocation: The portable playback device is updated to be grouped with the second playback device. The portable playback device is allocated all portions of audio. Where more two or more devices in the playback system are reproducing media independently, the trigger may indicate which one to select for grouping, for example the second playback device may be one with which a wireless communication was established, or which was indicated in the input. Coordinator: The second playback device associated with the room can be designated as group coordinator to reduce the possibility of playback being interrupted should the portable playback device be moved or run out of power.

Example 2: Trigger: A trigger is detected which is associated with a portable playback device which. The trigger can be an input in a control application, a wireless communication connection being established between the portable playback device and a second playback device associated with a room or a long button press on the portable playback device. Configuration information: the configuration information shows the portable playback device is currently reproducing first media and the second playback device is currently reproducing second media different from the first. Audio Allocation: As result the playback device is updated to be grouped with the second device and reproducing second media. The playback device is allocated all portions of audio of the second media, so the portable playback device begins reproducing the second media. Where more two or more devices in the playback system are reproducing media independently, such as second and third media respectively, the trigger may indicate which one to select for grouping, for example the second playback device may be one with which a wireless communication was established, or which was indicated in the input. Coordinator: The second playback device associated with the room can be designated as group coordinator to reduce the possibility of playback being interrupted should the portable playback device be moved or run out of power.

Example 3: Trigger: A trigger is detected which is associated with a first portable playback device which. The trigger can be an input in a control application, a wireless communication connection being established between the first portable playback device and a second portable playback device, a long button press on the first portable playback device, or establishing NFC communication with the second portable playback device. Configuration information: the configuration information shows the first portable playback device is not currently reproducing media but the second portable playback device is reproducing media Audio Allocation: As result the first portable playback device is updated to be grouped with the second portable playback device. The first portable playback device is allocated all portions of audio and begins reproducing the media in synchrony with the second portable playback device. The second portable playback device may be indicated in the trigger, for example the one with which a wireless communication was established, or which was indicated in the input. Coordinator: The second portable playback device can be designated as group coordinator to reduce the possibility of playback being interrupted during a transfer of responsibility to the first device. In some circumstances the first playback device may be designated the coordinator, for example (i) when the first portable playback device is charging and the second is not, (ii) when both devices are on battery and the second portable devices remaining battery is lower than the first playback device's remaining battery, (iii) when both devices are on battery and the second portable device's battery is below a first threshold and the first portable device's battery is above a second threshold higher than the first threshold or (iv) when both devices are on battery and the first portable device's remaining battery is a predetermined amount higher than the second portable device's remaining battery. When the coordinator is to be changed, the coordinator may be changed at the next media change, such as between songs, to reduce perceptible interruption.

Example 4: Trigger: A trigger is detected which is associated with a first portable playback device. The trigger can be an input in a control application, a wireless communication connection being established between the first portable playback device and a second portable playback device, a long button press on the portable playback device, or establishing NFC communication with the second portable playback device. Configuration information: The configuration information shows that the first portable playback device is currently reproducing first media and the second portable playback device is reproducing second, different media. Audio Allocation: As result the first portable playback device is updated to be grouped with the second portable playback device. The configuration information is used to determine which of the first and second portable playback devices began playing most recently (for example by examining a variable storing a local time at which playback was started at each device). Whichever playback device started earlier has its audio allocation updated to reproduce all portions of audio of the media reproduced by the other device. In other words the most device which started playing most recently continues reproduction and the other device joins it. Coordinator: Whichever device is not updated is made the coordinator. In some examples the other device may be made coordinator, such as in the same circumstances as explained for example 3 above, when the other device has a more reliable power source or greater power reserves.

Example 5: Trigger: A trigger is detected which is associated with a first portable playback device. The trigger can be an input in a control application, a wireless communication connection being established between the first portable playback device and a second portable playback device, a long button press on the portable playback device, or establishing NFC communication with the second portable playback device. Configuration Information: The configuration information shows the first portable playback device is currently reproducing live media, such as radio, and that the second portable playback device is not reproducing media. Audio Allocation: As result the first portable playback device is updated to be grouped with the second portable playback device. The second portable playback device is allocated all portions of audio and begins reproducing the media in synchrony with the first portable playback device. The second portable playback device may be indicated in the trigger, for example the one with which a wireless communication was established, or which was indicated in the input. Coordinator: The first portable playback device can be designated as group coordinator to reduce the possibility of playback being interrupted during a transfer of responsibility to the second device. In some circumstances the second playback device may be designated the coordinator, such as discussed above for Example 3 when the second portable playback device has a more reliable power source or greater power reserves than the first playback device.

Example 6: Trigger: A trigger is detected which is associated with a first portable playback device. The trigger can be an input in a control application, a wireless communication connection being established between the first portable playback device and a second playback device associated with a room, or a long button press on the first portable playback device. Configuration Information: The configuration information shows that the first portable playback device is currently reproducing live media, such as radio, and the second playback device associated with a room is not reproducing media. Audio Allocation: As result the first portable playback device is updated to be grouped with the second playback device. The second playback device is allocated all portions of audio and begins reproducing the media in synchrony with the first portable playback device. The second playback device may be indicated in the trigger, for example the one with which a wireless communication was established, or which was indicated in the input. Coordinator: The first portable playback device can be designated as group coordinator to reduce the possibility of playback being interrupted during a transfer of responsibility to the second playback device. In some circumstances the second playback device may be designated the coordinator, such as when the first portable playback device is operating on battery power and has a remaining battery life below a threshold, such as 15%.

Example 7: Trigger: A trigger is detected for a playback device associated with a room which the configuration information shows is not currently reproducing media. The trigger can be an input in a control application, a wireless communication connection being established between the playback device and a portable playback device or a long button press on the playback device. Configuration information: The configuration information shows that the playback device associated with a room is not currently reproducing media and the portable playback device is reproducing media. Audio allocation: As result the playback device is updated to be grouped with the portable playback device and allocated all portions of audio. Coordinator: The playback device associated with the room can be designated as group coordinator to reduce the possibility of playback being interrupted should the portable playback device be moved or run out of power.

Example 8: Trigger: A trigger is detected for a playback device associated with a room. The trigger can be an input in a control application, a wireless communication connection being established between the playback device and a portable playback device or a long button press on the playback device. Configuration Information: The configuration information shows that the playback device associated with a room is currently reproducing first media and the portable playback device is reproducing second, different media. Audio allocation: As result the playback device is updated to be grouped with the portable playback device and the portable playback device is updated play the second media in synchrony with the playback device and to be allocated all portions of the audio. Coordinator: The playback device associated with the room is designated as group coordinator to reduce the possibility of playback being interrupted should the portable playback device be moved or run out of power.

Example 9: Trigger: A trigger is detected for a playback device associated with a room. The trigger can be an input in a control application, a wireless communication connection being established between the playback device and a portable playback device or a long button press on the playback device. Configuration Information: The configuration information shows that the playback device associated with a room is currently reproducing live media, such as radio, and the portable playback device is not reproducing media. Audio allocation: As result the playback device is updated to be grouped with the portable playback device and the portable playback device is updated play the media in synchrony with the playback device and to be allocated all portions of the audio. Coordinator: The playback device associated with the room is designated as group coordinator to reduce the possibility of playback being interrupted should the portable playback device be moved or run out of power.

In all of the examples 1 to 9 above, whichever playback device was updated was allocated all portions of the audio (for example all channels and frequencies). For example, a playback device may be updated to be allocated all portions of audio when the configuration information indicates at least one of:

the device is a portable playback which is operating on battery power, optionally operating on battery with below a predetermined threshold of battery life remaining. This reduces perception of interruption should the portable playback device run out of battery. In other cases a playback device may be updated to be allocated a subset of less than all portions of audio, such as a particular channel; and the configuration information indicates that one of the devices is already part of a bonded group and/or is already allocated a subset of audio portions which indicates that it is part of a bonded group.

In further examples, the audio allocation may be updated to a subset of less than all of the audio portions based on the configuration information and possibly also preference information and the nature of the trigger. As discussed above, playback devices may be bonded to reproduce particular subsets of audio, such as a particular channel (left, right, and additional channels for surround or home theater such as rear left and rear right) or a particular frequency (frequencies below a cut off frequency, such as 100 Hz, for a subwoofer). Configuring playback devices in this way can be time consuming and involve multiple steps for a user. According to embodiments, one or more playback devices are automatically allocated respective subsets of audio to simply this configuration.

One possible scenario is the automatic bonding of two playback devices based on a trigger and configuration information to form a stereo pair with one device allocated a left channel and the other device allocated a right channel. Another scenario is the automatic bonding of three devices to form a Home Theater setup. A first device, such as soundbar or soundbase, is allocated front audio channels, and second and third devices are allocated rear left and rear right channels respectively. Automatic bonding where subsets of audio portions are allocated to different devices can be carried out, for example, when the configuration information indicates at least one of:

All the devices have the same identifier, such as the same room name. This may facilitate bonding when a portable playback device is returned to a room it was in before it was moved.

Figure 5:
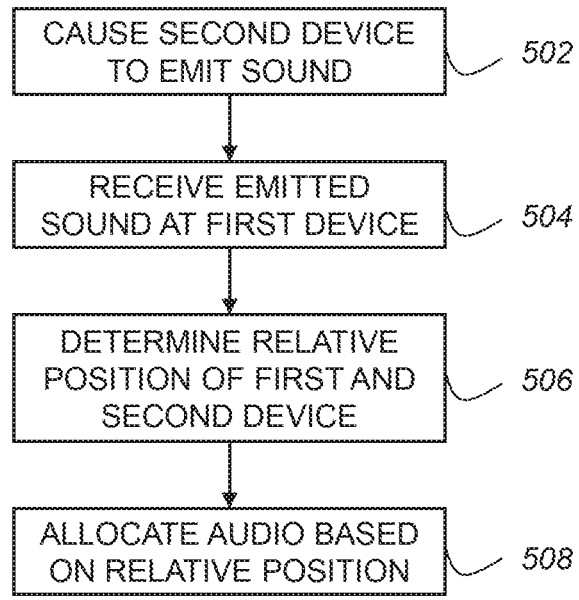
FIG. 5 is a flow chart of an example method of determining the relative positions of playback devices that can be used with, for example, the method of FIG. 4.

One of the devices is already allocated all of the portions of audio, indicating that it is not already bonded with another device;

When playback devices are allocated subsets of audio based on channels, it is required to determine which playback device should be allocated which channel, for example, which playback device is positioned on a right side and which is positioned on a left side. It is desirable if this could also be carried out automatically or with a minimum of user input, so that configuration is quicker and less prone to human error in assigning channels to playback devices. FIG. 5 shows a method by which a playback device including a microphone array can determine its physical location within a playback area relative to other playback devices. Allocation of audio channels can then be based on that determination.

First, at block 502 a second playback device is caused to emit a sound, for example a command or instruction causes the second playback device to emit a sound or tone. The sound may be audible or inaudible, for example it can be ultrasonic, provided that the microphone array can detect it.

The emitted sound is received by the first playback device at block 504, where it is recorded by the microphone array. The direction of the audio is determined, for example, as discussed above, the beamforming and self-sound suppression components 312*l* and 312*m* of a NMD can detect the direction of a received sound. The sound signal may be chosen so that it is unlikely to be identified as voice input. Additional example techniques to identify the direction of the audio using a microphone array include: (1) identifying the microphone from a plurality of microphones in the microphone array that received the sound first (e.g., on the basis that the microphone that detected the sound first is likely the closest microphone to the sound source); and/or (2) identifying the microphone from the plurality of microphones that detected the sound emitted by the second playback devices with the highest pressure level, such as a highest peak pressure level and/or a highest average pressure level during detection of the sound (e.g., on the basis that the microphone that detected the highest pressure level is likely the closest microphone to the sound source).

At block 506, the direction of the received sound is processed to determine the relative position of the first and second playback devices. For example, in stereo configuration if the sound is determined as coming from the left side relative to the front of the playback device then the playback device is likely positioned on the right side relative to the listening position. Similarly, if the sound is determined as coming from the right side relative to front of the playback device then the playback device is likely positioned on the left side relative to the listening position. In a surround sound or home theater configuration a front device, such as a soundbar or soundbase, may emit the sound generally from the center. If the sound is determined as coming generally from a right side relative to a front of the device then the playback device is located at the rear left position relative to the listening position. Similarly, if the sound is determined as coming generally from a left side relative to a front of the device then the playback device is located at the rear right position relative to a listening position.

At block 508, audio portions allocated to the playback devices are updated based on the determined relative position. More specifically, particular audio channels such as left, right, left rear and right rear, are allocated to the playback devices based on their determined relative positions.

Figure 6:
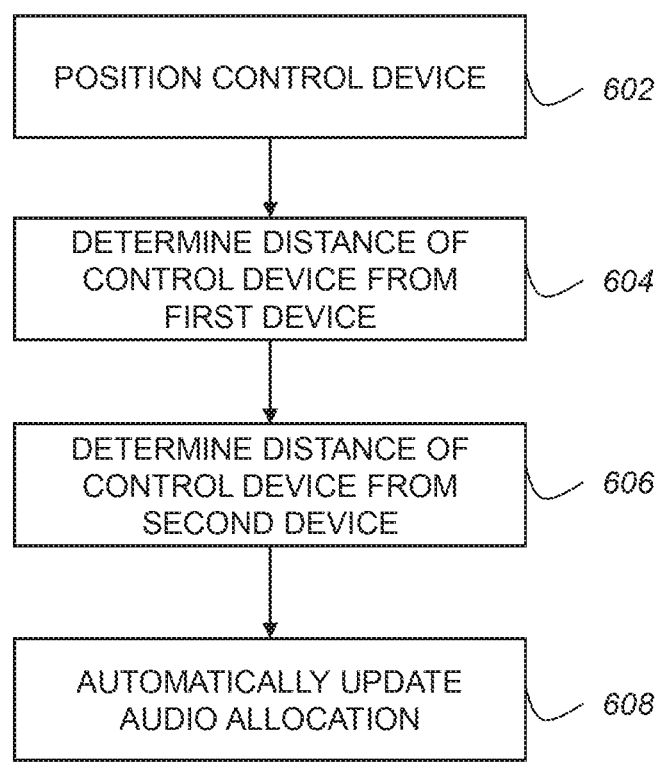
FIG. 6 is a flow chart of another example method of determining the relative positions of playback devices that can be used with, for example, the method of FIG. 4.

While the method has been described from the point of view of the first device being one of the playback devices for which the position is to be determined, a similar method can be used with another playback device, a control device or any network connected device having a microphone and a predetermined position. FIG. 6 shows a method in which the relative position of the playback devices can be determined using a control device. At block 602 the control device is positioned in a predetermined position. For example, a user may be directed by an indication on the display of the control device to "Position this control device near the left speaker".

Once in position, at blocks 604 and 606 the distance of the control device from the first playback device and the second playback device, respectively, is determined. This may be done by causing each playback device to emit sound (e.g., at the same volume) and measuring the intensity of sound received by a microphone of the control device. For example, the first playback device may emit sound at a given volume for a first period of time while the second playback device is silent (e.g., not playing sound) and, after the first period of time, the second playback device may emit sound at the same volume for a second period of time while the first playback device is silent. In another example, the first playback device and the second playback device may emit sound simultaneously at different frequencies, such as different frequency tones, such that the control device can distinguish between sound from the first playback device and sound from the second playback device. Whichever playback device's sound was recorded with the highest intensity by the microphone is closest to the control device. If the control device was near a left playback device then the device with the highest intensity received sound is the left device. In this way, a position can be determined without requiring a directional microphone array to determine a direction, which may not be present on a control device.

Other methods of determining the distance can be used which do not use sound. For example, a wireless communication signal may be used to determine a distance. In a similar way to the sound example discussed above, an intensity of a wireless signal from the playback device will be greater the closer the playback device is to the control device. This can be measured directly using RSSI, or more indirectly by reading the physical communication rate of the channel (which is proportional to signal strength) or the bit error rate (which is inversely proportional to signal strength). Other methods such as Bluetooth proximity profile (PXP) may also be used.

Whichever way the distance is determined in blocks 604 and 606 these blocks may be carried out simultaneously or sequentially. If carried out simultaneously different sounds or wireless communication signals may be used to allow the playback devices to be distinguished from each other.

At block 608 the allocation of audio portions to the playback devices is automatically updated based on the determined distances.

The method of FIG. 6 can be used by other devices separate from the devices to be positioned as well as control devices. These other devices include a further playback device or a Internet of Things device including a microphone and having a predetermined position. If the device cannot easily be moved, it can remain at its present location (assuming that it is near enough the playback area to determine the position of the playback devices to be located). When the device is not moved its location may already be known or may be received as an input.

As discussed above, various techniques are described to automatically identify relative positions of playback devices (e.g., in bonded zones such as stereo pair and home theater configurations) so as to intelligently assign audio portions to the playback devices. It should be appreciated that the playback device(s) and/or the control device may refuse the automatic assignment of audio portions in cases where the relative positions of the playback devices were identified with a low degree of confidence. For example, the playback device(s) and/or the control device may generate a confidence value for the identified relative positions of the playback devices indicative of the confidence in the accuracy of the identified relative positions. In this example, the playback device(s) and/or the control device may compare the confidence value with a threshold and refuse the automatic assignment of audio portions when the confidence value does not exceed the threshold (e.g., the confidence is low). Additionally, the playback device(s) and/or the control device may prompt the user to intervene (e.g., via one or more audible and/or visual instructions) by, for example, requesting the user to manually indicate which playback device is at a particular relative position (e.g., which speaker is the left speaker in a stereo pair, which speaker is the right speaker in a stereo pair, which speaker is the left rear satellite in a home theater setup, which speaker is a right rear satellite in a home theater setup, etc.). Alternatively, the playback device(s) and/or the control device may, for example, simply assign all of the audio portions to all of the playback devices in instances where the relative confidence of the determined relative position does not exceed the threshold so as not to require user input. In this example, the playback device(s) and/or the control device may notify the user (e.g., via an audible and/or visual message) that the automatic assignment of audio portions based on a determined relative position was refused and the playback devices are simply each reproducing all of the audio portions.

Updating Audio Allocation Automatically when Playback Devices are Removed from a Group.

The examples discussed above all dealt with joining playback devices together and responsively updating the audio allocation. Further examples will now be described in which playback devices are removed and the audio allocation is updated automatically.

Example 10. Configuration information: The configuration information shows that a playback device associated with a room and a portable playback device are reproducing media in synchrony. Trigger: A long press is received at the portable playback device or an input is received to remove the portable playback device from a control device. Updated allocation: The portable playback device is ungrouped and all audio allocation is removed. The playback device associated with the room continues to reproduce the media. If the playback device associated with the room was previously reproducing a subset of less than all audio portions the audio allocation can be updated to include all audio portions.

Example 11. Configuration information: The configuration information shows that a playback device associated with a room and a portable playback device are reproducing media in synchrony. Trigger: A long press is received at the playback device associated with a room or an input is received from a control device to remove the playback device associated with a room. Updated allocation: The playback device associated with a room is ungrouped and all audio allocation is removed. The portable playback device continues to reproduce the media. If the portable playback device was previously reproducing a subset of less than all audio portions the audio allocation can be updated to include all audio portions.

Example 12. Configuration information: The configuration information shows that a playback device associated with a room and a portable playback device are reproducing media in synchrony. Trigger: Wireless communication indicates that the devices are no longer in proximity, for example a Bluetooth connection between them is lost or indicates a separation distance above a predetermined threshold. Updated allocation: The portable playback device is ungrouped and all audio allocation is removed. The playback device associated with the room continues to reproduce the media. If the playback device associated with the room was previously reproducing a subset of less than all audio portions the audio allocation can be updated to include all audio portions.

Example 13. Configuration information: The configuration information shows that a first portable playback device and a second portable playback device are reproducing media in synchrony with both reproducing all audio portions Trigger: Wireless communication indicates that the devices are no longer in proximity, for example a Bluetooth connection between them is lost or indicates a distance is greater than a predetermined threshold. Updated allocation: Whatever portable playback device was the group coordinator in the group continues reproducing media while the other portable playback device stops playing music and is updated to be allocated no audio portions. In the alternative, both portable playback devices could stop reproducing media and are allocated no audio portions. Which of these alternatives happens could be determined from the preference information.

Example 14. Configuration information: The configuration information shows that a first portable playback device and a second portable playback device are reproducing media in synchrony as a bonded group, with each reproducing different audio portions. Trigger: Wireless communication indicates that the devices are no longer in proximity, for example a Bluetooth connection between them is lost or indicates a distance is greater than a predetermined threshold. Updated allocation: Whatever portable playback device was the group coordinator in the group continues reproducing media and its allocation is updated to all audio portions while the other portable playback device stops playing music and is updated to be allocated no audio portions. In the alternative, both portable playback devices could stop reproducing media and are allocated no audio portions. In yet another alternative, both portable playback devices start reproducing all of the audio portions (e.g., the pair of portable playback devices transition from being in a bonded group such as a stereo pair to each reproducing all audio portions in synchrony). Which of these alternatives happens could be determined from the preference information.

In examples 13 and 14, the range at which the portable playback devices ungroup may be different from the range at which the portable playback devices group. For example, the portable playback devices may need to be within approximately 3n (10 feet) for Bluetooth proximity to provide a trigger to group the devices, while the devices may need to be separated by at least about 7.6 m (25 feet) for Bluetooth proximity to provide an ungrouping trigger.

Updating Audio Allocation in Response to Voice Input

In further examples, the audio allocation may be updated to respond to voice input. In one example a portable playback device including a microphone, such as that described above with reference to FIG. 3, may detect the voice command and push the command to the cloud. The voice command may be processed in the cloud (or locally in instances where the playback device has a local natural language understanding (NLU) engine) and the voice input further forms a trigger to update the audio allocations to other playback devices when providing a response to the voice input.

Conventionally, responses to a given voice commands are always provided by one network microphone device that is determined to be closest to the user when the voice command was uttered. Such a rigid system, however, provides an unintuitive user experience in households with multiple network microphone devices. For example, a user may issue a voice command while sitting on the couch and surrounded by a home theater system comprising three network microphone devices (e.g., in the form of a soundbar, a left rear satellite, and a right rear satellite). In this example, a conventional system may determine that the left rear satellite is the closest to the user and issue the voice response from the left rear satellite. Such a response to the voice command from the left rear satellite is unexpected to the user at least because most of the audible speech during media content playback comes from the soundbar instead of the rear satellites. Accordingly, the techniques described above to intelligently allocate audio portions based on configuration information and/or preference information may be readily applied to network microphone devices to improve the user experience.

In some embodiments, a portable network microphone device may be grouped with one or more stationary network microphone devices (e.g., as indicated in the configuration information). In these embodiments, the audio portions associated with the response to the voice input detected by one or more network microphones within the group may be preferentially provided by the stationary playback devices instead of the portable playback device unless particular conditions are met. Such preferential allocation to the stationary playback devices in the group may make the voice response easier for the user to hear given the larger dimensions and/or power budget of the stationary playback devices. Example conditions where the audio portions associated with the response may be allocated to the portable network microphone device instead include conditions where the user is far away from the stationary network microphone devices (e.g., the sound pressure level of the voice command detected by the stationary network microphone devices is below a threshold).

In another example, a portable playback device is configured as left rear playback device in a surround or home theater setup and this reflected in the configuration information. This device may detect a voice command and push the command to the cloud. In this example, the audio allocations are adjusted so that the soundbar at the front of the home theater system reproduces the response as the primary device in the home theater configuration.

In other examples, in addition to updating the audio allocation, microphones on portable playback devices may be deactivated altogether when the configuration information indicates that they are being grouped with other devices which also include a microphone. This may be indicated by reference to a model number which is known to include a microphone, or by a specific variable or property which indicates whether a device includes a microphone. For example, the Beam and One commercially available from Sonos, Inc include a microphone array and this could be determined with reference to the model name or a model number corresponding the name.

Controlling Internet of Things Devices

In some examples, the trigger may indicate that an Internet of Things (IoT) device, such as a smart lightbulb, power switch or thermostat is in proximity to a portable playback device. For example the trigger may be an input from a control application, wireless proximity detection, such as using Bluetooth proximity profile or a long button press. Responsively the portable playback associates itself with the IoT devices so that voice inputs which do not specify a location of an IoT device are application the IoT device automatically. In one example, a portable playback device could be brought into a room with a smart bulb and bond with the smart bulb. As a result, a voice command "turn off the lights" received by the portable playback device is associated with the smart bulb. The portable playback device triggers the bonded smart bulb to turn off (instead of another smart bulb in another room).

The methods described above can be carried out by playback devices, control devices or even by remote devices, such as a remote server system on the internet. The device which runs the process may be the device which determines the trigger (such as receiving a long button press or NFC activation) or another device, such as a cloud server processing a received voice input. Embodiments also include computer programs comprising computer program code that when executed by a processing system caused the processing system to implement the method. A non-transitory computer readable medium may have computer program code embodied thereon that, when executed by a processing system, causes the processing system to implement the method.

V. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods. Responsive to a trigger, audio allocations to one or more playback devices can be automatically updated based on configuration information. This can simplify system configuration and allow easier set up of a playback system as playback devices are moved and/or added.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

Example Features (Feature 1) A playback device comprising: a wireless interface configured to receive audio data comprising a plurality of audio portions; a speaker for reproducing at least one of the plurality of audio portions received via the wireless interface; a storage; and a processing system; wherein the storage comprises non-transitory computer-readable instructions that, when executed by the processing system, instruct the playback device to: responsive to a trigger associated with the playback device and indicating that the playback device is to be grouped with another playback device for playback of media: retrieve configuration information related to the playback device and the another playback device; cause the playback device and the another playback device to join together in a group for synchronous media playback; and automatically update an allocation of the audio portions for reproduction by the playback device based on the configuration information.

(Feature 2) The playback device of feature 1, wherein the non-transitory computer-readable instructions, when executed by the processor, instruct the playback device to: determine either: that the configuration information indicates that the another playback device is configured to reproduce all the audio portions, or that the configuration information indicates that both the playback device and the another playback device have a same associated identifier, and responsively allocate a first subset of the audio portions to the playback device and a second subset of the audio portions to the another playback device, wherein the first subset and second subset are different.

(Feature 3) The playback device of feature 2, further comprising: a microphone array; and wherein the non-transitory computer-readable instructions, when executed by the processor, instruct the playback device to: cause the another playback device to emit a sound; receiving the sound via the microphone array; and determine a position of the playback device relative to the another playback device based on the received sound and the first subset and the second subset are based on the position.

(Feature 4) The playback device of feature 1, further comprising: a battery; wherein the non-transitory computer-readable instructions, when executed by the processor, instruct the playback device to: determine that the playback device is operating on battery power and that a remaining battery life of the playback device is below a predetermined threshold, and responsively allocating all audio portions to the playback device.

(Feature 5) A playback device comprising: a wireless interface configured to receive audio data comprising a plurality of audio portions; a speaker for reproducing at least one of the plurality of audio portions received via the wireless interface; a microphone array; a storage; and a processing system; wherein the storage comprises non-transitory computer-readable instructions that, when executed by the processor instruct the playback device to: responsive a voice input received by the microphone array: retrieve configuration information related to the playback device and another playback device; and automatically update an allocation of the audio portions for the playback device to reproduce the response to the voice input based on the configuration information.

(Feature 6) The playback device of feature 5, wherein the non-transitory computer-readable instructions, when executed by the processor, further instruct the playback device to: determine that the configuration information indicates the playback device is configured to reproduce a first subset of the audio portions in synchrony with the another playback device and responsively updating the allocation of audio portions between the playback device and the another playback device such that the response to the voice input is reproduced by the another playback device and not the playback device.

(Feature 7) A method of allocating audio data between a first playback device and a second playback device, wherein the audio data comprises a plurality of audio portions, the method comprising: detecting a trigger associated with the first playback device; responsive to detecting the trigger: retrieving configuration information related to the first playback device and the second playback device; and automatically updating an allocation of the audio portions for reproduction by at least one of the first playback device and the second playback device based on the configuration information.

(Feature 8) The method of feature 7, wherein the trigger indicates that the first playback device is to be grouped with the second playback device for playback of media, the method further comprising: further responsive to detecting the trigger, causing the first playback device and the second playback device to join together in a group of playback device for media playback; and wherein the automatically updating the allocation of the audio portions comprises automatically updating the allocation of the audio portions for reproduction of media in synchrony by the first and second playback devices.

(Feature 9) The method of feature 8, wherein the automatically updating the allocation of the audio portions for reproduction of media in synchrony comprises: determining that the configuration information indicates that the second playback device is configured to reproduce all the audio portions, and responsively allocating a first subset of the audio portions to the first playback device and a second subset of the audio portions to the second playback device, wherein the first subset and second subset are different.

(Feature 10) The method of feature 8, wherein the automatically updating the allocation of the audio portions for reproduction of media in synchrony comprises: determining that the configuration information indicates that both the first playback device and the second playback device have a same associated identifier, and responsively allocating a first subset of the audio portions to the first playback device and a second subset of the audio portions to the second playback device, wherein the first subset and second subset are different.

(Feature 11) The method of feature 9, further comprising: determining a position of the first playback device relative to the second playback device; and allocating the first and second subsets of the audio portions based on the determined position.

(Feature 12) The method of feature 11, wherein the determining a position comprises: causing the second playback device to emit a sound; receiving the sound via a microphone array comprising a plurality of microphones provided on the first playback device; and determining the position based on the relative magnitude of the received sound at two or more of the plurality of microphones in the microphone array.

(Feature 13) The method of feature 11, wherein the determining a position comprises: determining a first proximity of a control device to the first playback device; determining a second proximity of the control device to the second playback device; and determining the position based on the first proximity, the second proximity, and a predetermined position of the control device.

(Feature 14) The method of feature 13, wherein: the determining the first proximity comprises causing the first playback device to emit a first sound and receiving the first sound via at least one microphone on a control device; and the determining the second proximity comprises causing the second playback device to emit a second sound and receiving the second sound via the at least one microphone on the control device.

(Feature 15) The method of feature 13, wherein the determining the first proximity is based on a wireless communication between the control device and the first playback device; and the determining the second proximity is based on a wireless communication between the control device and the second playback device.

(Feature 16) The method of feature 8, further comprising: retrieving preference data, wherein the automatically updating the allocation of audio portions is further based on the preference data.

(Feature 17) The method of feature 8, further comprising: determining that the configuration information indicates that the second playback device is configured to reproduce a subset of all channels of audio, and responsively allocating all audio portions to the first playback device.

(Feature 18) The method of feature 8, further comprising: determining that the configuration information indicates that the first playback device is operating on battery power and that a remaining battery life of the first playback device is below a predetermined threshold, and responsively allocating all audio portions to the first playback device.

(Feature 19) The method of feature 7, wherein the trigger is a voice input received by a microphone array on the first playback device, and the automatically updating the allocation of audio portions for reproduction comprises determining at least one playback device to respond to the voice input.

(Feature 20) The method of feature 19, wherein the voice input is further received by a microphone array on the second playback device, and the automatically updating the allocation of audio portions is further based on the voice input received by the first playback device and the voice input received by the second playback device.

(Feature 21) A playback device comprising: a communication interface configured to facilitate communication via one or more data networks; at least one audio amplifier configured to drive at least one speaker; at least one processor; at least one non-transitory computer-readable medium comprising program instructions that are executable by the at least one processor such that the playback device is configured to: reproduce one or more first audio channels of audio content in synchrony with reproduction of one or more second audio channels of the audio content by another playback device; detect a trigger event indicating that the playback device is in proximity of the other playback device, wherein the trigger event comprises detection of a change in position of the playback device relative to the other playback device; after detection of the trigger event, retrieve configuration information related to the playback device and the other playback device; retrieve preference information indicating a preference of at least one user; based on the configuration information and the preference information, cause an allocation of audio channels between the playback device and the other playback device to be updated; and reproduce one or more third audio channels of the audio content based on the updated allocation of the audio channels.

(Feature 22) The playback device of feature 21, wherein the audio content comprises a left channel and a right channel, wherein the one or more first audio channels comprises the left audio channel and the right audio channel, and wherein the one or more second audio channels comprises the left audio channel and the right audio channel.

(Feature 23) The playback device of feature 22, wherein the one or more third audio channels comprises one of: the left audio channel and the right audio channel.

(Feature 24) The playback device of feature 23, wherein the program instructions that are executable by the at least one processor such that the playback device is configured to cause the allocation of audio channels between the playback device and the other playback device to be updated comprises program instructions that are executable by the at least one processor such that the playback device is configured to: determine a position of the playback device relative to the other playback device; and based on the determined position of the playback device relative to the other playback device, assign the playback device one of the left audio channel and the right audio channel for reproduction.

(Feature 25) The playback device of feature 24, wherein the playback device comprises a plurality of microphones and wherein the program instructions that are executable by the at least one processor such that the playback device is configured to determine a position of the playback device relative to the other playback device comprises program instructions that are executable by the at least one processor such that the playback device is configured to: cause the other playback device to emit a sound; detect the acoustic signal using the microphone array; and based on the detected acoustic signal, determine a position of the playback device relative to the other playback device.

(Feature 26) The playback device of any of features 21-25, wherein the program instructions that are executable by the at least one processor such that the playback device is configured to retrieve the preference information comprises program instructions that are executable by the at least one processor such that the playback device is configured to: causing a computing device to present one or more playback options; and receive, from the computing device, an indication of at least one selection from the one or more playback options.

(Feature 27) The playback device of any of features 21-26, further comprises at least one sensor configured to sense movement of the playback device.

(Feature 28) The playback device of feature 27, wherein the program instructions that are executable by the at least one processor such that the playback device is configured to detect the trigger event comprises program instructions that are executable by the at least one processor such that the playback device is configured to: detect movement of the playback device by the at least one sensor.

(Feature 29) The playback device of feature 28, wherein the program instructions that are executable by the at least one processor such that the playback device is configured to detect the trigger event comprises program instructions that are executable by the at least one processor such that the playback device is configured to: after detection of movement of the playback device, cause the other playback device to emit a wireless signal; detect, using the communication interface, the wireless signal; and based on the detected wireless signal, determine whether the playback device is in proximity to the other playback device.

(Feature 30) The playback device of feature 28, wherein the playback device comprises at least one microphone and wherein the program instructions that are executable by the at least one processor such that the playback device is configured to detect the trigger event comprises program instructions that are executable by the at least one processor such that the playback device is configured to: after detection of movement of the playback device, cause the other playback device to emit an acoustic signal; detect, using the at least one microphone, the acoustic signal; and based on the detected acoustic signal, determine whether the playback device is in proximity to the other playback device.

(Feature 31) The playback device of feature 30, wherein the acoustic signal comprises an ultrasonic signal.

(Feature 32) A method performed by a playback device, the method comprising: reproducing one or more first audio channels of audio content in synchrony with reproduction of one or more second audio channels of the audio content by another playback device; detecting a trigger event indicating that the playback device is in proximity of the other playback device, wherein the trigger event comprises detection of a change in position of the playback device relative to the other playback device; after detecting the trigger event, retrieving configuration information related to the playback device and the other playback device; retrieving preference information indicating a preference of at least one user; based on the configuration information and the preference information, causing an allocation of audio channels between the playback device and the other playback device to be updated; and reproducing one or more third audio channels of the audio content based on the updated allocation of the audio channels.

(Feature 33) The method of feature 32, wherein the audio content comprises a left channel and a right channel, wherein the one or more first audio channels comprises the left audio channel and the right audio channel, and wherein the one or more second audio channels comprises the left audio channel and the right audio channel.

(Feature 34) The method of feature 33, wherein the one or more third audio channels comprises one of: the left audio channel and the right audio channel.

(Feature 35) The method of feature 34, wherein causing the allocation of audio channels between the playback device and the other playback device to be updated comprises: determining a position of the playback device relative to the other playback device; and based on the determined position of the playback device relative to the other playback device, assigning the playback device one of the left audio channel and the right audio channel for reproduction.

(Feature 36) The method of feature 35, wherein determining the position of the playback device relative to the other playback device comprises: causing the other playback device to emit a sound; detecting the acoustic signal using the microphone array; and based on the detected acoustic signal, determining the position of the playback device relative to the other playback device.

(Feature 37) The method of any of features 32-36, wherein retrieving the preference information comprises: causing a computing device to present one or more playback options; and receiving, from the computing device, an indication of at least one selection from the one or more playback options.

(Feature 38) The method of any of features 32-36, wherein detecting the trigger event comprises: detecting movement of the playback device by at least one sensor.

(Feature 39) The method of feature 38, wherein detecting the trigger event comprises: after detection of movement of the playback device, causing the other playback device to emit a wireless signal; detecting the wireless signal emitted by the other playback device; and based on the detected wireless signal, determining whether the playback device is in proximity to the other playback device.

(Feature 40) The method of feature 38, wherein detecting the trigger event comprises: after detection of movement of the playback device, causing the other playback device to emit an acoustic signal; detecting, using the at least one microphone, the acoustic signal; and based on the detected acoustic signal, determining whether the playback device is in proximity to the other playback device.

(Feature 41) One or more non-transitory computer-readable media comprising program instructions that are executable by the at least one processor such that a playback device is configured to: reproduce one or more first audio channels of audio content in synchrony with reproduction of one or more second audio channels of the audio content by another playback device; detect a trigger event indicating that the playback device is in proximity of the other playback device, wherein the trigger event comprises detection of a change in position of the playback device relative to the other playback device; after detection of the trigger event, retrieve configuration information related to the playback device and the other playback device; retrieve preference information indicating a preference of at least one user; based on the configuration information and the preference information, cause an allocation of audio channels between the playback device and the other playback device to be updated; and reproduce one or more third audio channels of the audio content based on the updated allocation of the audio channels.

(Feature 42) A playback device comprising: a communication interface configured to facilitate communication via one or more data networks; at least one audio amplifier configured to drive at least one speaker; at least one processor; at least one non-transitory computer-readable medium comprising program instructions that are executable by the at least one processor such that the playback device is configured to: reproduce one or more first audio channels of audio content in synchrony with reproduction of one or more second audio channels of the audio content by another playback device; detect a trigger event indicating that the playback device is no longer in proximity of the other playback device, wherein the trigger event comprises detection of a change in position of the playback device relative to the other playback device; after detection of the trigger event, retrieve configuration information related to the playback device and the other playback device; based on the retrieved configuration information, cause an allocation of the audio content between the playback device and the other playback device to be updated; and reproduce one or more third audio channels of the audio content based on the updated allocation of the audio channels.

(Feature 43) The playback device of feature 42, wherein the program instructions that are executable by the at least one processor such that the playback device is configured to reproduce the one or more third audio channels comprises program instructions that are executable by the at least one processor such that the playback device is configured to: reproduce the one or more third audio channels in synchrony with reproduction of one or more fourth audio channels of the audio content by the other playback device.

(Feature 44) The playback device of any of features 42-43, wherein the audio content comprises a left channel and a right channel, wherein the configuration information indicates that the playback device and the other playback device operate as a stereo pair where the playback device is allocated one of the left channel and the right channel for reproduction.

(Feature 45) The playback device of feature 44, wherein the program instructions that are executable by the at least one processor such that the playback device is configured to cause the allocation of the audio content to be updated comprises program instructions that are executable by the at least one processor such that the playback device is configured to: cause each of the playback device and the other playback device to be allocated both the left channel and the right channel for playback.

(Feature 46) The playback device of any of features 42-45, wherein the audio content comprises a plurality of channels, wherein the one or more first channels comprises a first subset of the plurality of channels, wherein the one or more second channels comprises a second subset of the plurality of channels that is non-overlapping with the first subset of the plurality of channels, and wherein the one or more third channels comprises at least one channel from the first subset and at least one channel from the second subset.

(Feature 47) The playback device of any of features 42-46, further comprising at least one sensor configured to detect movement of the playback device and wherein the program instructions that are executable by the at least one processor such that the playback device is configured to detect the trigger event comprises program instructions that are executable by the at least one processor such that the playback device is configured to: detect movement of the playback device by the at least one sensor.

(Feature 48) The playback device of feature 47, wherein the program instructions that are executable by the at least one processor such that the playback device is configured to detect the trigger event comprises program instructions that are executable by the at least one processor such that the playback device is configured to: after detection of movement by the at least one movement sensor, cause the other playback device to emit a wireless signal; detect the wireless signal using the communication interface; and based on the detected wireless signal, determine that the playback device is no longer in proximity of the other playback device.

(Feature 49) The playback device of feature 47, further comprising at least one microphone and wherein the program instructions that are executable by the at least one processor such that the playback device is configured to detect the trigger event comprises program instructions that are executable by the at least one processor such that the playback device is configured to: after detection of movement by the at least one movement sensor, cause the other playback device to emit an acoustic signal; detect the acoustic signal using the at least one microphone; and based on the detected acoustic signal, determine that the playback device is no longer in proximity of the other playback device.

(Feature 50) The playback device of feature 49, wherein the acoustic signal comprises an ultrasonic signal.

(Feature 51) The playback device of any of features 42-50, wherein the program instructions that are executable by the at least one processor such that the playback device is configured to cause the allocation of the audio content to be updated comprises program instructions that are executable by the at least one processor such that the playback device is configured to: cause at least one of the playback device and the other playback device to update at least one equalization setting.

(Feature 52) The playback device of any of features 42-51, wherein the configuration information indicates that one of the playback device and the other playback device is designated as a group coordinator for synchronous playback and wherein the program instructions that are executable by the at least one processor such that the playback device is configured to cause the allocation of the audio content to be updated comprises program instructions that are executable by the at least one processor such that the playback device is configured to: cause the designation of the one of the playback device and the other playback device as group coordinator to be updated.

(Feature 53) A method performed by a playback device, the method comprising: reproducing one or more first audio channels of the audio content in synchrony with reproduction of one or more second audio channels of the audio content by another playback device; detecting a trigger event indicating that the playback device is no longer in proximity of the other playback device, wherein the trigger event comprises detection of a change in position of the playback device relative to the other playback device; after detecting of the trigger event, retrieving configuration information related to the playback device and the other playback device; based on the retrieved configuration information, causing an allocation of the audio content between the playback device and the other playback device to be updated; and reproducing one or more third audio channels of the audio content based on the updated allocation of the audio channels.

(Feature 54) The method of feature 53, wherein reproducing the one or more third audio channels comprises: reproducing the one or more third audio channels in synchrony with reproduction of one or more fourth audio channels of the audio content by the other playback device.

(Feature 55) The method of any of features 53-54, wherein the audio content comprises a left channel and a right channel, wherein the configuration information indicates that the playback device and the other playback device are configured as a stereo pair where the playback device is allocated one of the left channel and the right channel for reproduction, and wherein reproducing the one or more first audio channels comprises reproducing the one of the left channel and the right channel.

(Feature 56) The method of feature 55, wherein causing the allocation of the audio content to be updated comprises:

causing each of the playback device and the other playback device to be allocated both the left channel and the right channel for playback.

(Feature 57) The method of any of features 53-56, wherein the audio content comprises a plurality of channels, wherein reproducing the one or more first channels comprises: reproducing a first subset of the plurality of channels in synchrony with reproduction of a second subset of the plurality of channels that is non-overlapping with the first subset of the plurality of channels by the other playback device.

(Feature 58) The method of feature 57, wherein reproducing the one or more third channels comprises reproducing at least one channel from the first subset and at least one channel from the second subset.

(Feature 59) The method of any of features 53-58, detecting the trigger event comprises: detecting movement of the playback device by the at least one sensor; and after detection of movement by the at least one movement sensor, causing the other playback device to emit a wireless signal; detecting the wireless signal using the communication interface; and based on the detected wireless signal, determining that the playback device is no longer in proximity of the other playback device.

(Feature 60) The method of any of features 53-59, detecting the trigger event comprises: detecting movement of the playback device by the at least one sensor; and after detecting of movement by the at least one movement sensor, causing the other playback device to emit an acoustic signal; detecting the acoustic signal using the at least one microphone; and based on the detected acoustic signal, determining that the playback device is no longer in proximity of the other playback device.

(Feature 61) One or more non-transitory computer-readable media comprising program instructions that are executable by the at least one processor such that a playback device is configured to: reproduce one or more first audio channels of the audio content in synchrony with reproduction of one or more second audio channels of the audio content by another playback device; detect a trigger event indicating that the playback device is no longer in proximity of the other playback device, wherein the trigger event comprises detection of a change in position of the playback device relative to the other playback device; after detection of the trigger event, retrieve configuration information related to the playback device and the other playback device; based on the retrieved configuration information, cause an allocation of the audio content between the playback device and the other playback device to be updated; and reproduce one or more third audio channels of the audio content based on the updated allocation of the audio channels.

The invention claimed is:

1. A first playback device comprising:
a communication interface configured to facilitate communication via one or more data networks;
at least one audio amplifier configured to drive at least one speaker;
at least one processor;
at least one non-transitory computer-readable medium comprising program instructions that are executable by the at least one processor such that the first playback device is configured to:
reproduce one or more first audio channels of audio content in synchrony with reproduction of one or more second audio channels of the audio content by a second playback device;
detect a trigger event indicating that the first playback device is no longer in proximity of the second playback device, wherein the trigger event comprises detection of a change in position of the first playback device relative to the second playback device;
after detection of the trigger event:
retrieve configuration information related to the first playback device and the second playback device;
based on the retrieved configuration information, cause an allocation of the audio content between the first playback device and the second playback device to be updated; and
reproduce one or more third audio channels of the audio content based on the updated allocation of the audio channels;
wherein the audio content comprises a plurality of channels, wherein the one or more first channels comprises a first subset of the plurality of channels, wherein the one or more second channels comprises a second subset of the plurality of channels that is non-overlapping with the first subset of the plurality of channels, and wherein the one or more third channels comprises at least one channel from the first subset and at least one channel from the second subset.

2. The first playback device of claim 1, wherein the program instructions that are executable by the at least one processor such that the first playback device is configured to reproduce the one or more third audio channels comprises program instructions that are executable by the at least one processor such that the playback device is configured to:
reproduce the one or more third audio channels in synchrony with reproduction of one or more fourth audio channels of the audio content by the second playback device.

3. The first playback device of claim 1, wherein the audio content comprises a left channel and a right channel, wherein the configuration information indicates that the first playback device and the second playback device operate as a stereo pair where the first playback device is allocated one of the left channel or the right channel for reproduction and the second playback device is allocated the other of the left channel and the right channel for reproduction.

4. The playback device of claim 3, wherein the program instructions that are executable by the at least one processor such that the first playback device is configured to cause the allocation of the audio content to be updated comprises program instructions that are executable by the at least one processor such that the first playback device is configured to:
cause each of the first playback device and the second playback device to be allocated both the left channel and the right channel for playback.

5. The first playback device of claim 1, further comprising at least one sensor configured to detect movement of the first playback device and wherein the program instructions that are executable by the at least one processor such that the first playback device is configured to detect the trigger event comprises program instructions that are executable by the at least one processor such that the first playback device is configured to:
detect, via the at least one sensor, movement of the first playback device.

6. The first playback device of claim 5, wherein the program instructions that are executable by the at least one processor such that the first playback device is configured to detect the trigger event comprises program instructions that are executable by the at least one processor such that the first playback device is configured to:
  after detection of movement by the at least one movement sensor:
    cause the second playback device to emit a wireless signal;
    detect the wireless signal via the communication interface; and
    based on the detected wireless signal, determine that the first playback device is no longer in proximity of the second playback device.

7. The first playback device of claim 5, further comprising at least one microphone and wherein the program instructions that are executable by the at least one processor such that the first playback device is configured to detect the trigger event comprises program instructions that are executable by the at least one processor such that the first playback device is configured to:
  after detection of movement by the at least one movement sensor:
    cause the second playback device to emit an acoustic signal;
    detect the acoustic signal via the at least one microphone; and
    based on the detected acoustic signal, determine that the first playback device is no longer in proximity of the second playback device.

8. The first playback device of claim 7, wherein the acoustic signal comprises an ultrasonic signal.

9. The first playback device of claim 1, wherein the program instructions that are executable by the at least one processor such that the first playback device is configured to cause the allocation of the audio content to be updated comprises program instructions that are executable by the at least one processor such that the first playback device is configured to:
  cause at least one of the first playback device and the second playback device to update at least one equalization setting.

10. The first playback device of claim 1, wherein the configuration information indicates that one of the first playback device and the second playback device is designated as a group coordinator for synchronous playback and wherein the program instructions that are executable by the at least one processor such that the first playback device is configured to cause the allocation of the audio content to be updated comprises program instructions that are executable by the at least one processor such that the first playback device is configured to:
  cause the designation of the one of the first playback device and the second playback device as group coordinator to be updated.

11. A method performed by a first playback device, the method comprising:
  reproducing one or more first audio channels of the audio content in synchrony with reproduction of one or more second audio channels of the audio content by a second playback device, wherein the audio content comprises a plurality of channels, and wherein reproducing the one or more first channels comprises reproducing a first subset of the plurality of channels in synchrony with reproduction of a second subset of the plurality of channels that is non-overlapping with the first subset of the plurality of channels by the second playback device;
  detecting a trigger event indicating that the first playback device is no longer in proximity of the second playback device, wherein the trigger event comprises detection of a change in position of the playback device relative to the second playback device;
  after detecting of the trigger event:
    retrieving configuration information related to the first playback device and the second playback device;
    based on the retrieved configuration information, causing an allocation of the audio content between the first playback device and the second playback device to be updated; and
    reproducing one or more third audio channels of the audio content based on the updated allocation of the audio channels.

12. The method of claim 11, wherein reproducing the one or more third audio channels comprises:
  reproducing the one or more third audio channels in synchrony with reproduction of one or more fourth audio channels of the audio content by the second playback device.

13. The method of claim 11, wherein the audio content comprises a left channel and a right channel, wherein the configuration information indicates that the playback device and the second playback device are configured as a stereo pair where the first playback device is allocated one of the left channel and the right channel for reproduction, and wherein reproducing the one or more first audio channels comprises reproducing the one of the left channel or the right channel in synchrony with reproduction of the other of the left channel and the right channel by the second playback device.

14. The method of claim 13, wherein causing the allocation of the audio content to be updated comprises:
  causing each of the first playback device and the second playback device to be allocated both the left channel and the right channel for playback.

15. The method of claim 11, wherein reproducing the one or more third channels comprises reproducing at least one channel from the first subset and at least one channel from the second subset.

16. The method of claim 11, wherein the playback device comprises a communication interface and at least one sensor configured to detect movement of the first playback device, and wherein detecting the trigger event comprises:
  detecting, via the at least one sensor, movement of the first playback device; and
  after detection of movement by the at least one movement sensor,
    causing the second playback device to emit a wireless signal;
    detecting the wireless signal via the communication interface; and
    based on the detected wireless signal, determining that the playback device is no longer in proximity of the second playback device.

17. The method of claim 11, wherein the playback device comprises at least one microphone and at least one sensor configured to detect movement of the first playback device, and wherein detecting the trigger event comprises:
  detecting, via the at least one sensor, movement of the playback device; and
  after detecting of movement by the at least one movement sensor:
    causing the second playback device to emit an acoustic signal;
    detecting the acoustic signal via the at least one microphone; and based on the detected acoustic signal, determining that the playback device is no longer in proximity of the second playback device.

18. One or more non-transitory computer-readable media comprising program instructions that are executable by the at least one processor such that a first playback device is configured to:

reproduce one or more first audio channels of audio content in synchrony with reproduction of one or more second audio channels of the audio content by a second playback device, wherein the audio content comprises a plurality of channels, and wherein reproducing the one or more first channels comprises reproducing a first subset of the plurality of channels in synchrony with reproduction of a second subset of the plurality of channels that is non-overlapping with the first subset of the plurality of channels by the second playback device;

detect a trigger event indicating that the first playback device is no longer in proximity of the second playback device, wherein the trigger event comprises detection of a change in position of the first playback device relative to the second playback device;

after detection of the trigger event:
retrieve configuration information related to the first playback device and the second playback device;

based on the retrieved configuration information, cause an allocation of the audio content between the first playback device and the second playback device to be updated; and reproduce one or more third audio channels of the audio content based on the updated allocation of the audio channels.

* * * * *